(12) United States Patent
Mizuno et al.

(10) Patent No.: US 7,908,538 B2
(45) Date of Patent: Mar. 15, 2011

(54) FAILURE PREDICTION CIRCUIT AND METHOD, AND SEMICONDUCTOR INTEGRATED CIRCUIT

(75) Inventors: Masayuki Mizuno, Tokyo (JP); Toru Nakura, Tokyo (JP); Koichi Nose, Tokyo (JP)

(73) Assignee: NEC Corporation, Tokyo (JP)

( * ) Notice: Subject to any disclaimer, the term of this patent is extended or adjusted under 35 U.S.C. 154(b) by 205 days.

(21) Appl. No.: 12/438,576

(22) PCT Filed: Aug. 9, 2007

(86) PCT No.: PCT/JP2007/065623
§ 371 (c)(1),
(2), (4) Date: Feb. 24, 2009

(87) PCT Pub. No.: WO2008/023577
PCT Pub. Date: Feb. 28, 2008

(65) Prior Publication Data
US 2010/0251046 A1    Sep. 30, 2010

(30) Foreign Application Priority Data

Aug. 24, 2006  (JP) .................................. 2006-227942
Jan. 23, 2007  (JP) .................................. 2007-012876

(51) Int. Cl.
*G01R 31/28* (2006.01)
(52) U.S. Cl. ........................... 714/733; 714/731; 714/744
(58) Field of Classification Search .................. 367/122; 326/93; 713/400; 714/733, 731, 744
See application file for complete search history.

(56) References Cited

U.S. PATENT DOCUMENTS

| | | | | | |
|---|---|---|---|---|---|
| 4,969,132 | A | * | 11/1990 | Reed | 367/122 |
| 5,345,426 | A | * | 9/1994 | Lipschutz | 367/103 |
| 5,534,796 | A | * | 7/1996 | Edwards | 326/93 |
| 7,065,665 | B2 | * | 6/2006 | Jacobson et al. | 713/400 |
| 2005/0246613 | A1 | | 11/2005 | Blaauw et al. | |

FOREIGN PATENT DOCUMENTS

| | | |
|---|---|---|
| JP | 1997166650 A | 6/1997 |
| JP | 2005214732 A | 8/2005 |
| JP | 2005277087 A | 10/2005 |

OTHER PUBLICATIONS

International Search Report for PCT/JP2007/065623 mailed Nov. 6, 2007.
Das et al., IEEE Journal of Solid-State Circuits, vol. 41, No. 4, Apr. 2006, p. 792-804.

* cited by examiner

*Primary Examiner* — David Ton

(57) ABSTRACT

Disclosed is a semiconductor integrated circuit including a first storage circuit and a second storage circuit that respectively store logic levels of an input to the delay circuit and an output of the delay circuit when a logic level of a clock line is changed, and a determination circuit that determines whether or not the results of the first storage circuit and the second storage circuit coincide or not. Even if a transistor or a wiring that constitutes the semiconductor integrated circuit has been degraded due to secular change or the like, a possibility of an anomaly or a failure in one of the operation circuits caused by the degradation can be predicted before the anomaly or the failure occurs.

30 Claims, 19 Drawing Sheets

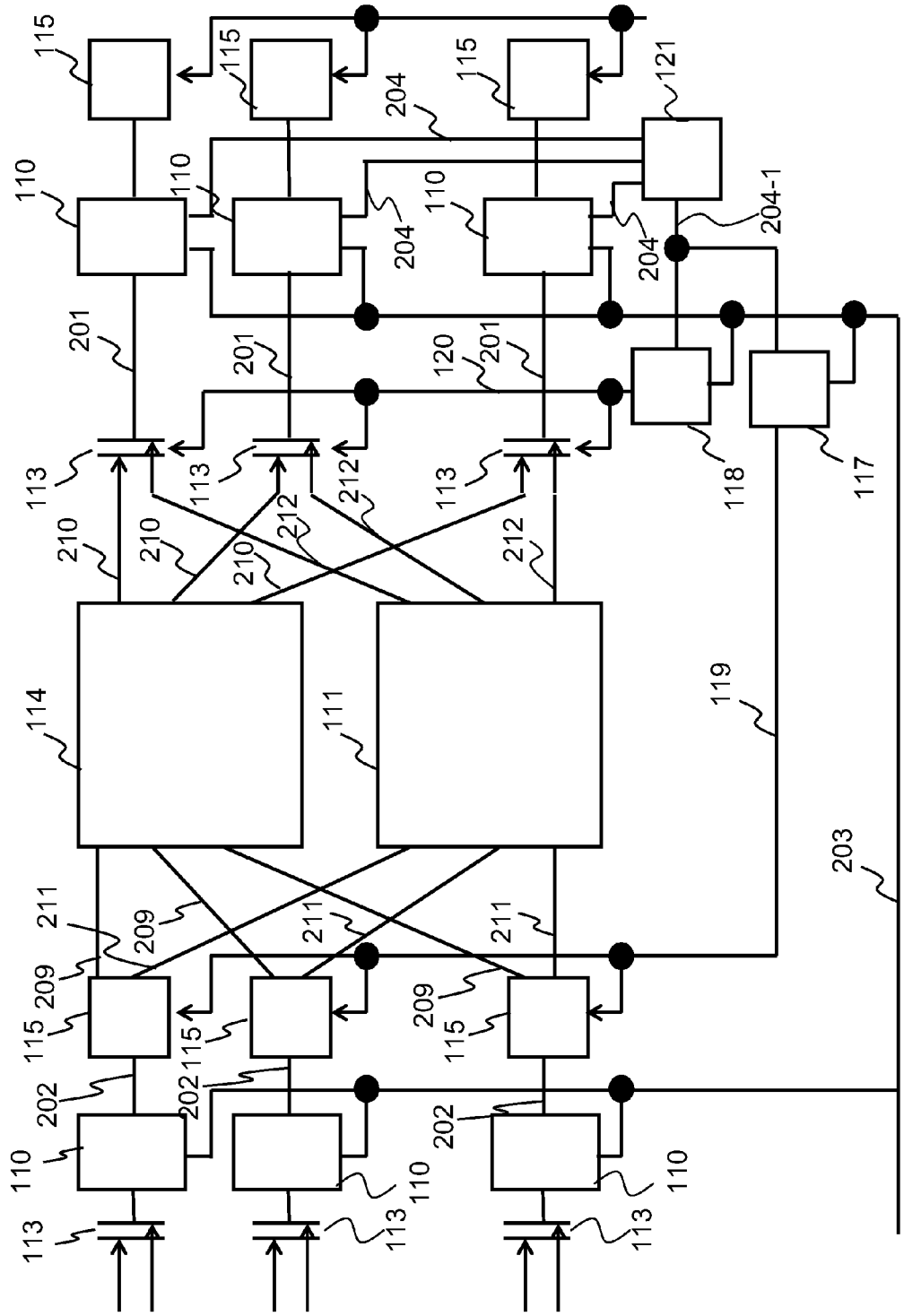

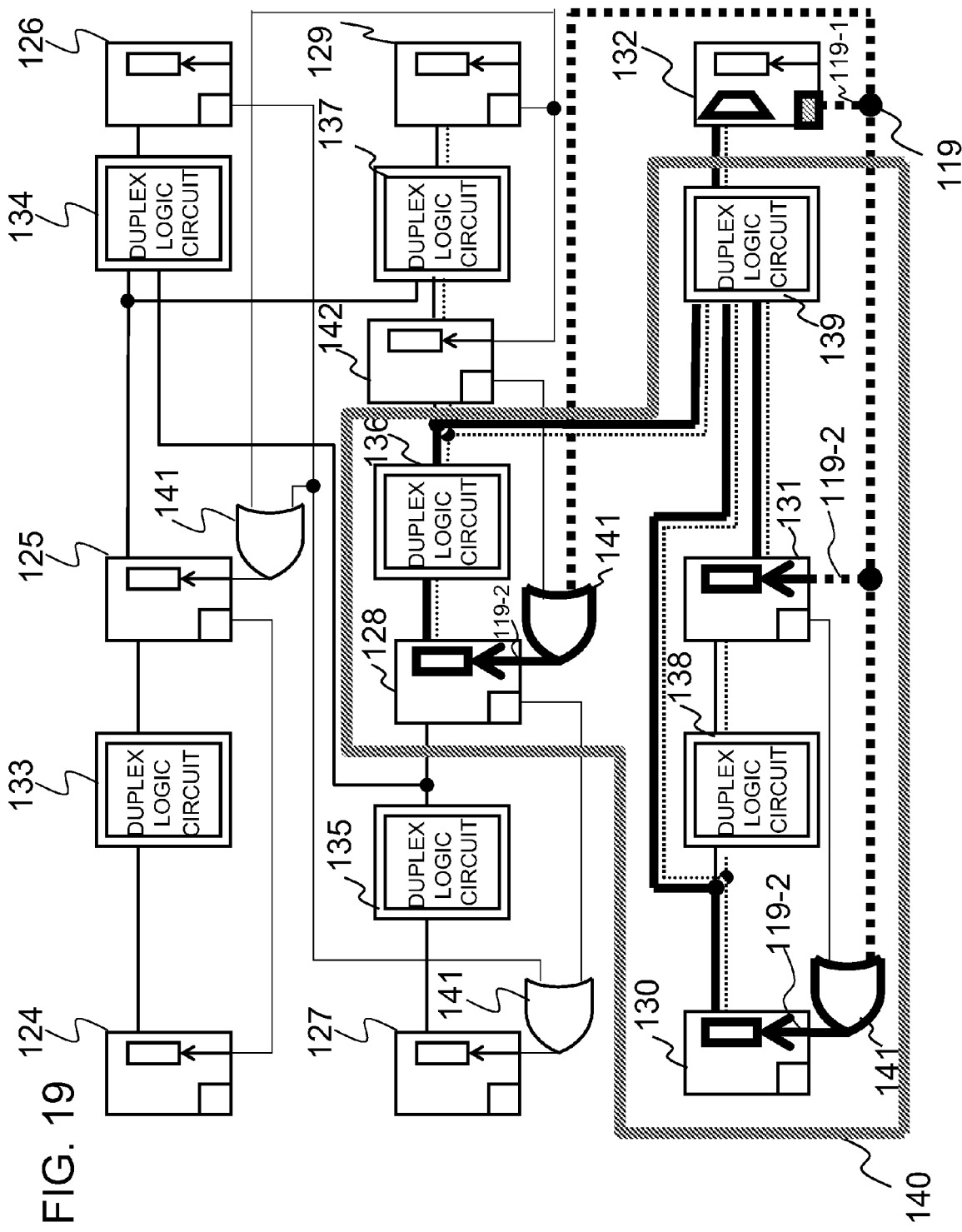

FAILURE PREDICTION CIRCUIT AND METHOD, AND SEMICONDUCTOR INTEGRATED CIRCUIT

REFERENCE TO RELATED APPLICATION

This application is the National Phase of PCT/JP2007/065623, filed Aug. 9, 2007, and is based upon and claims the benefit of the priority of Japanese patent application No. 2006-227942, filed on Aug. 24, 2006, and Japanese patent application No. 2007-012876, filed on Jan. 23, 2007, the disclosures of which are incorporated herein in its entirety by reference thereto.

TECHNICAL FIELD

Background Art

Conventional semiconductor integrated circuits are formed of a synchronous circuit that uses a plurality of flip-flop circuits each of which delivers the logic level of an input line to an output line responsive to a change in the logic level of a clock line. Between pipeline register circuits, an operation circuit that performs a logic operation or an arithmetic operation is present.

Each of FIGS. 1, 2, and 3 in Patent Document 1 (U.S. Patent Publication US2005/0246613A1 by Blaauw et al.) discloses a configuration in which an output of an operation circuit is received by an ordinary flip-flop circuit, and is also received by a latch circuit within a time interval of a half clock cycle, and depending on whether values of both of the circuits are different, it is determined whether or not a delay time of the operation circuit exceeds a clock cycle time.

Further, as shown in FIGS. 4A and 4B of Patent Document 1, the configuration is disclosed in which when the delay time of the operation circuit exceeds the clock cycle time, operation of the semiconductor integrated circuit is temporarily stopped, and processing is resumed using the operation result received by the latch circuit. In each of FIGS. 22 and 25 in Patent Document 1, a configuration in which an output of an operation circuit is received by an ordinary flip-flop circuit and is also received by a transition detection latch circuit that detects whether or not the output of the operation circuit is changed within a time interval of a half clock cycle, and depending on whether values of both of the circuits differ, it is determined whether or not the delay time of the operation circuit exceeds a clock cycle time. Each of FIGS. 23, 24A, and 24C in Patent Document 1 discloses a configuration in which when the delay time of an operation circuit exceeds a clock cycle time, the operation result of the operation circuit is discarded, and processing is resumed using the same operation circuit, if possible.

Non-patent Document 1 (by Das et al., "A Self-Tuning DVS Processor Using Delay-Error Detection and Correction", IEEE Journal of Solid-State Circuits, Vol. 41, No. 4, April 2006, p 792-804) discloses in FIG. 2 thereof a configuration in which an output of an operation circuit is received by an ordinary flip-flop circuit and is also received by a latch circuit within a time interval of a half clock cycle, and depending on whether values of both of the circuits differ, it is determined whether or not the delay time of the operation circuit exceeds a clock cycle time.

Non-patent Document 1 further discloses a configuration in which when the delay of the operation circuit exceeds the clock cycle time, the semiconductor integrated circuit is temporarily stopped, and processing is resumed using the result of operation received by the latch circuit.

[Patent Document 1] U.S. Patent Publication No. 2005/0246613 A1

[Non-patent Document 1] Das et al., "A Self-Tuning DVS Processor Using Delay-Error Detection and Correction", IEEE Journal of Solid-State Circuits, Vol. 41, No. 4, April 2006, p 792-804

SUMMARY OF THE DISCLOSURE

Problems to be Solved by the Invention

Disclosures of Patent Document 1 and Non-patent Document 1 described above are herein incorporated by reference. Analyses of the related arts by the present invention will be given below.

Generally, in conventional semiconductor integrated circuits, performance of a transistor or a line that constitutes an operation circuit is degraded due to secular change, so that the delay time of the operation circuit increases. When the delay time exceeds a clock cycle time, an incorrect operation result is output.

Further, it is difficult to know whether or not an operation in the operation circuit is incorrect.

In the case of the configurations in Patent Document 1 and Non-patent Document 1, there are the following problems.

A first problem is that at a time point when the result of operation by the operation circuit is found to be incorrect, the incorrect result has been already output from the flip-flop circuit.

That is, the output of the operation circuit is received by the ordinary flip-flop circuit and by the latch circuit that observes the output of the operation circuit over the time interval of a half clock cycle from a timing when the flip-flop circuit obtains data and outputs the result, and values of the outputs of the operation circuit received by both of the circuits are compared, thereby determining whether or not the delay of the operation circuit exceeds the clock cycle time (in other words, whether or not an incorrect operation is performed). Thus, at the time point when the operation result is found to be incorrect, the incorrect result has been already output from the flip-flop circuit. In other words, before the incorrect operation is performed, the incorrect operation cannot not be predicted in advance.

A second problem is that, unless the minimum delay time of the operation circuit is set to be large, a malfunction will be caused.

The output of the operation circuit is received both by the ordinary flip-flop circuit and the latch circuit that observes the result of the output over the time interval of a half clock cycle. Thus, the hold time of a RAZOR FF in FIG. 2A in Non-patent Document 1 (paper written by Das et al.), for example, is increased. Thus, unless the minimum delay time of the operation circuit is set to be large, the malfunction will be caused. This brings about an increase in the size of the operation circuit and an increase in the chip area and an increase in power consumption.

A third problem is that, since only one operation circuit that performs the same operation is present, it is necessary to temporarily stop the semiconductor integrated circuit, use the operation result received by the latch circuit again, and resume processing. Alternatively, after an anomaly or a failure has been detected, it is necessary to discard the operation result and resume the processing using the same operation circuit, if possible.

For this reason, when the operation circuit is degraded due to secular change or the like, the semiconductor integrated circuit may become inoperable or it becomes necessary to reduce performance of the semiconductor integrated circuit to operate by reducing its power supply voltage or clock frequency, for example. To put it briefly, the operation cannot be continued with the original performance.

Accordingly, an object of the present invention is to provide a failure prediction circuit, a pipeline register circuit, a semiconductor integrated circuit, and a failure prediction method which are capable of implementing especially high reliability.

Another object of the present invention is to provide a failure prediction circuit, a pipeline register circuit, a semiconductor integrated circuit, and a failure prediction method which predict that degradation of a transistor or a wiring that constitutes the semiconductor integrated circuit due to secular change or the like may lead to an anomaly or a failure of an operation circuit before the anomaly or the failure occurs.

Still another object of the present invention is to provide a failure prediction circuit, a pipeline register circuit, a semiconductor integrated circuit, and a failure prediction method that allow at which location of a chip a possibility of an anomaly or a failure increases to be known in advance even if a transistor or a wiring that constitutes the semiconductor integrated circuit has been degraded due to secular change or the like.

Still another object of the present invention is to provide a failure prediction circuit, a pipeline register circuit, a semiconductor integrated circuit, and a failure prediction method that are capable of constantly avoiding performance deterioration in terms of speed and power even if a transistor or a wiring that constitutes the semiconductor integrated circuit has been degraded due to secular change or the like.

A failure detection circuit according to one aspect (aspect) of the present invention includes:
first and second storage circuits that stores respective logic levels of an input to and an output of a delay circuit connected to a data line when a logic level of a clock line is changed; and
a determination circuit that determines whether or not the results of the first and second storage circuits are the same.

A failure detection circuit according to the present invention may include:
a first storage circuit that stores a logic level of a data line when a logic level of a clock line connected to a delay circuit is changed;
a second storage circuit that stores a logic level of the data line when a logic level of an output of the delay circuit is changed; and
a determination circuit that determines whether or not the results of the first and second storage circuits are the same.

A failure detection circuit according to the present invention includes:
first and second storage circuits that store logic levels of a data line when a logic level of a clock line is changed; and
a determination circuit that determines whether or not the results of the first and second storage circuits are the same. A logic threshold by which the first storage circuit determines a logic level of the data line and a logic threshold by which the second storage circuit that determines a logic level of the data line are set to values that are different to each other.

The failure detection circuit according to the present invention may include:
a circuit that stores a prediction of a failure when the failure is predicted and holds a result of the determination, when it is determined whether or not the results of the first and second storage circuits are the same and then the results of the first and second storage circuits are determined not to be the same.

A pipeline register circuit according to other aspect of the present invention is a register circuit that receives a data signal output from an operation circuit. The pipeline register circuit includes first and second storage circuits each of which samples an input data signal and outputs the sampled data signal, in response to a clock signal. At least one of input timings of the data signal, input timings of the clock signal, and input logic thresholds of the data signal are set to be different from each other between the first and second storage circuits in data sampling. The pipeline register circuit includes means for determining whether or not the outputs of the first and second storage circuits coincide. The output of a predetermined one of the first and second storage circuits is set to register output data.

In the present invention, in one clock cycle, an operation of each operation circuit included before and after the pipeline register circuit is completed and an operation result is supplied to the operation circuit in a subsequent stage through the pipeline register circuit. The operation and supply of the operation result performed in the one clock cycle are repeated for each clock cycle. The timings at which the pipeline register circuit obtains the data signal indicating the operation result from the operation circuit in a preceding stage is set to be before a timing at which the pipeline circuit outputs the data signal to the operation circuit in the subsequent stage so as to determine whether or not the operation result from the operation circuit in the preceding stage is correct, thereby allowing prediction of a failure in the operation circuit in the preceding stage in advance.

A pipeline register circuit according to the present invention includes:
the failure prediction circuit according to the present invention described above:
the data line of the failure prediction circuit being supplied to the pipeline register circuit and the output of the first storage circuit in the failure prediction circuit being set to an output of the pipeline register circuit.

A pipeline register circuit according to the present invention samples and holds a logic level of a data input line when a logic level of a clock line is changed from a first logic level to a second logic level, and outputs the logic level to a data output line. The pipeline register circuit includes:
a plurality of storage circuits which respectively hold logic levels of the data input line;
delay means for mutually spacing apart timings of holding the logic levels of the data input line by the storage circuits in time; and
a determination circuit that outputs an output of the storage circuit held last in time through the data output line and compares the logic levels held by the storage circuits.

A semiconductor integrated circuit according to the present invention is formed of a synchronous circuit that uses a plurality of pipeline register circuits, each pipeline register circuit outputting a logic level of an input line to an output line, responsive to a change in a logic level of a clock line. The synchronous circuit may include:
two operation circuits that perform equivalent logic or arithmetic operations, an input signal to each of the operation circuits being connected to an output signal of the pipeline register circuit;
a selector circuit that determines which one of output signals of the respective operation circuits is connected to an input signal to the pipeline register circuit; and
the failure prediction circuit included in the pipeline register circuit. According to a result of the determination circuit, switching in the selector circuit may be made.

A semiconductor integrated circuit is formed of a synchronous circuit that uses a plurality of pipeline register circuits, each pipeline register circuit outputting a logic level of an input line to an output line, responsive to a change in a logic level of a clock line. The synchronous circuit may include:

two operation circuits that perform equivalent logic or arithmetic operations;

a switch circuit that determines which one of input signals to the respective operation circuit is connected to an output signal of the pipeline register circuit;

a selector circuit that determines which one of output signals of the respective operation circuits is connected to an input signal to the pipeline register circuit; and the failure prediction circuit provided in the pipeline register circuit. According to a result of the determination circuit, switching in the selector circuit and switching in the selector circuit may be made.

The semiconductor integrated circuit according to the present invention may include:

circuits which generate switching control signals that control switching in the switch circuit and switching in the selector circuit, respectively. A timing at which the switching in the selector circuit is made may be set to be after a timing at which the switching in the switch circuit is made, and may be controlled to be delayed from the timing of the switching in the switch circuit, by one clock cycle or more.

A semiconductor integrated circuit is formed of a synchronous circuit that uses a plurality of pipeline register circuits, each pipeline register circuit outputting a logic level of an input line to an output line, responsive to a change in a logic level of a clock line. The synchronous circuit may include:

the failure prediction circuit provided in the pipeline register circuit; and a circuit that stores information on which failure prediction circuit within a chip has predicted a failure when the failure prediction circuit predicts the failure, and then information on the failure has been collected in a specific location in the chip through a scan path that serially connects the pipeline registers.

In the semiconductor integrated circuit according to the present invention, by counting the number of scan clocks, it may be identified by which failure prediction circuit on the pipeline register circuit, the failure has been predicted.

In the semiconductor integrated circuit according to the present invention, the information on which failure prediction circuit within the chip has predicted the failure may be stored in the chip or a nonvolatile memory provided outside the chip.

In a semiconductor integrated circuit comprising:

a delay value of the delay circuit or values of the logic thresholds may be adjusted after manufacture of a chip.

In a failure prediction method according to the present invention, each of first and second storage circuits receives a data signal output from an operation circuit, samples the data signal in response to an input clock signal, and outputs the sampled data signal. The method includes the steps of:

setting at least one of input timings of the data signal, input timings of the clock signal, and input logic thresholds of the data signal to be different from each other between the first and second storage circuits;

comparing the output of the first storage circuit with the output of the second storage circuit when a logic level of a clock line transitions from a first logic level to a second logic level; and predicting a type of a failure or a failure location in the operation circuit, based on a comparison result of the outputs of the first storage circuit and the second storage circuit.

In the semiconductor integrated circuit according to the present invention, each of the first and second operation circuits is divided into functional blocks; and the semiconductor integrated circuit includes:

a failure determination circuit that determines presence or absence of a failure based on outputs (outputs of the functional blocks) of the first and second operation circuits. Then, according to a determination result of the failure determination circuit, an output destination of the pipeline register circuit is switched to a corresponding input (input to a corresponding one of the functional blocks) to one of the first and second operation circuits, and one of the outputs of the first and second operation circuits is selected and supplied to an input to a corresponding one of the pipeline register circuits in a subsequent stage.

A semiconductor integrated circuit according to the present invention may include:

a plurality of pipeline register circuits each of which outputs a logic level of an input line to an output line, responsive to a change in a logic level of a clock line, each of the pipeline register circuits being constituted from the pipeline register circuit according to the present invention described above;

first and second operation circuits that perform equivalent logic or arithmetic operations, each of the first and second operation circuits being divided into functional blocks;

switch circuits, each switch circuit switching connection of the output of the pipeline register circuit to either one of inputs to the first and operation circuits;

selector circuits, each selector circuits selecting one of outputs of the first and second operation circuits and connecting the selected output to an input of the pipeline register circuit in a subsequent stage, the switch circuits and the selector circuits being provided corresponding to a plurality of data wirings of the first and second operation circuits; and a failure determination circuit that receives determination results from the determination circuits of a plurality of the pipeline register circuits and determines presence of a failure in one of the plurality of the pipeline register circuits. According to a determination result of the failure determination circuit, the switch circuit may perform switching of an output destination of the pipeline register circuit to a corresponding input to one of the first and second operation circuits (input to one of the functional blocks), and the selector circuit may select the one of the outputs of the first and second operation circuits to be supplied to an input to a corresponding one of the pipeline register circuits in a subsequent stage.

In the semiconductor integrated circuit according to the present invention, when the determination result of the determination circuit in one of the pipeline register circuits indicates a failure, the determination result may be transmitted to the switch circuit that performs switching of connection of an output of other one of the pipeline register circuits which operates on an input to the one of the pipeline register circuits, to either one of the inputs to the first and second operation circuits, and the switch circuit may perform switching of connection of the output of the other one of the pipeline register circuits to either one of the inputs to the first and second operation circuits, according to the determination result of the failure in the one of the pipeline register circuits.

A semiconductor integrated circuit according to the present invention includes:

a plurality of duplex logic circuits, each duplex logic circuit including first and second operation circuits that perform equivalent logic or arithmetic operations;

a plurality of failure prediction register circuits each comprising:

a selector circuit that selects one of outputs of the first and second operation circuits of the duplex logic circuit and outputs the selected output;

a pipeline register circuit that receives the output of the selector circuit; and a switch circuit that switches connection of an output of the pipeline register circuit to either one of inputs to the first and second operation circuits in the duplex logic circuit that receives the output of the pipeline register circuit;

the pipeline register circuit being constituted from the pipeline register circuit according to the present invention described above;

as a signal that performs switching, a determination result of the determination circuit in the pipeline register circuit in one of the failure prediction register circuits being directly supplied to the switch circuit connected to one of the failure prediction register circuits through one or a plurality of the duplex logic circuits, not through any one of the failure prediction register circuits, or being supplied to the switch circuit through a logic circuit, the logic circuit receiving a determination result of the determination circuit in the pipeline register circuit in other one of the failure prediction register circuits, together with the determination result in the one of the failure prediction register circuits, and outputting the signal that performs switching when one of the received determination results indicates a failure.

The present invention may include:

a failure determination circuit that determines presence or absence of a failure based on outputs of a plurality of the functional blocks, the functional blocks being obtained by division of each of the operation circuits.

According to a determination result of the failure determination circuit, switching of an output determination of the pipeline register circuit to an input to one of the functional blocks may be made, and switching of an output from the one of the functional blocks to an input to the pipeline register in a subsequent stage may be made. When a determination result of one of the pipeline register circuits indicates a failure, switching of an output determination of other one of the pipeline register circuits to one of the operation circuits or one of the functional blocks may be made. The output determination operates on an input to the one of the pipeline register circuits.

The semiconductor integrated circuit may include:

a first region where switching of respective outputs to the functional blocks and switching of respective inputs from the functional blocks are made according to the result of the failure determination circuit; and a second region where switching of respective outputs to the first and second operation circuits is made according to the result of the determination circuit.

According to the present invention, a factor that has not yet lead a failure but may be a failure in the future is detected in advance. The failure of the semiconductor integrated circuit can be thereby detected in advance while continuing operation of the semiconductor integrated circuit.

According to the present invention, an increase in the size of the operation circuit, an increase in the chip area, and an increase in power consumption can be avoided, and a failure in the operation circuit or the like can be detected in advance.

According to the present invention, it can be known in advance at which location of the chip a possibility of an anomaly or a failure is increased.

According to the present invention, even if a transistor or a wiring that constitutes the semiconductor integrated circuit has been degraded due to secular change or the like, it can be constantly so arranged that performance deterioration does not occur in terms of both speed and power.

For the above reasons, according to the present invention, a semiconductor integrated circuit with high reliability can be provided.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

FIG. 17 is a diagram showing a configuration of an eleventh exemplary embodiment of the present invention;

FIG. 19 is a diagram showing the configuration of the twelfth exemplary embodiment of the present invention.

PREFERRED MODES FOR CARRYING OUT THE INVENTION

Figure 1:
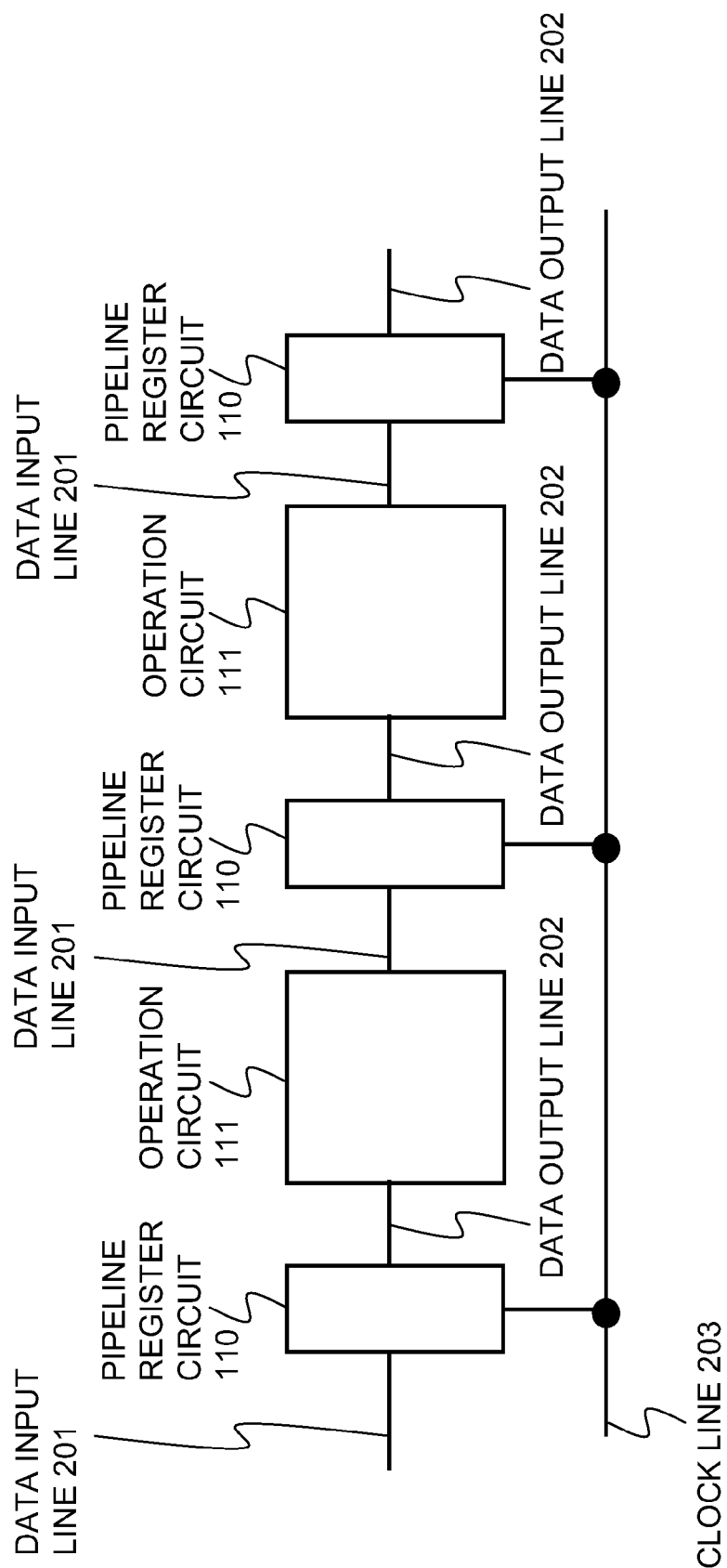
FIG. 1 is a diagram showing a configuration of an exemplary embodiment of the present invention.

An outline of the present invention will be described. A failure prediction circuit according to the present invention includes first and second storage circuits each of which receives a data signal output from an operation circuit, and samples and outputs the data signal in response to an input clock signal. In the first and second storage circuits, at least one of data signal input timings, clock signal input timings, and input logic thresholds of the data signal are set to be different from each another between the first and second storage circuits. Then, coincidence/non-coincidence of the outputs from the first and second storage circuits is determined.

Assume that there is an anomaly or a failure as follows in a device or a line that constitutes an operation circuit:

A transistor or a wiring that constitutes a semiconductor integrated circuit has been degraded due to secular change or stress.

Due to dust or the like between wirings, a wiring that should not be originally connected is connected in a high resistive state.

A wiring space is abnormally close and a line that should not be originally connected is therefore connected with a high capacity.

There is an anomaly in connection of a via that connects wirings, and the connecting portion becomes highly resistive.

Then, there is a characteristic that the delay time of the operation circuit becomes longer than the delay time of the operation circuit in a normal state.

Generally, such degradation does not lead to a failure such as inoperability, malfunction, or erroneous signal transmission of the semiconductor integrated circuit. The degradation gradually proceeds with time.

As described above, in conventional arts, there are the following problems:

Detection of a failure in the semiconductor integrated circuit cannot be performed until the failure occurs.

When a failure occurs, it is necessary to stop operation.

In the present invention, a factor that may be a failure in the future rather than the failure is detected in advance. The failure of the semiconductor integrated circuit can be thereby detected while continuing operation of the semiconductor integrated circuit.

That is, in the present invention, when the delay time of the operation circuit has increased, and the increase in the delay time can be detected before the delay time exceeds a clock cycle time, a possibility of an anomaly or a failure in the operation circuit can be detected in advance.

When the possibility of the anomaly or failure in the operation circuit can be detected in advance, the following measure may be taken:

A warning is given to a user who is using the semiconductor integrated circuit while letting the user to continue using the semiconductor integrated circuit.

The circuit is reconfigured so that the operation circuit in question is not used. As a result, influence of the failure can be minimized.

Semiconductor integrated circuits generally operate in synchronization with a clock signal. Thus, the above measure is taken, using a property that even if the delay time of the operation circuit is increased due to a defect such as degradation, the increased delay time does not cause a failure unless the delay time of the operation circuit exceeds a clock cycle time.

A pipeline register circuit in a semiconductor integrated circuit according to the present invention includes first and second storage circuits (101, 102), each formed of a flip-flop circuit, a latch circuit, or the like that stores the logic level of a data input line when the logic level of a clock line is changed. Input data timings, input clock timings, and input logic thresholds are set to be different between the first and second storage circuits. The pipeline register circuit includes a determination circuit (104) that compares outputs of the first and second storage circuits and determines whether or not the delay time of a logic circuit is close to the clock cycle time.

With this arrangement, it can be detected that the delay time of the operation circuit is close to the clock cycle time, and occurrence of an anomaly or a failure in the operation circuit can be detected in advance.

Further, a hold time of the pipeline register circuit is not set to be larger than that of an ordinary flip-flop circuit. Accordingly, no increase in the size of the operation circuit, no increase in the chip area, and no increase in power consumption occur.

In the conventional arts, there is a method of measuring an operation state during execution of operation. However, a failure is detected only after the failure has occurred. It is therefore impossible to predict the failure in advance.

The reason for this is as follows. In the case of the conventional arts, when a timing at which a pipeline register circuit obtains data to be output to an operation circuit provided in a subsequent stage from an operation circuit in a preceding stage, is indicated by a, when a timing at which the pipeline register circuit outputs the data to the operation circuit in the subsequent stage is indicated by b, and when a timing at which the pipeline register circuit obtains an operation result from the operation circuit in the preceding stage in order to determine whether or not the operation result of the operation circuit in the preceding stage is correct is indicated by c, the timing b occurs after the timing a, and the timing c occurs after the timing b. Alternatively, the timings a, b, and c simultaneously occur.

That is, since the timing c does not set to be before the timing b, the failure cannot be predicted in advance in the conventional arts.

On contrast therewith, in the present invention, the timing c sets to be before the timing b. Accordingly, a failure can be predicted in advance.

Further, in the semiconductor integrated circuit according to the present invention, it is determined in advance which one of output signals of the first and second storage circuits each formed of the flip-flop circuit that stores therein the logic level of the data input line is to be output from the pipeline register circuit.

When it is determined which one of the output signals of the first and second storage circuits is to be output after comparison of the results of the first and second storage circuits, a timing at which an operation result is output will vary according to a result of the comparison. In the case of an ordinary digital circuit, this variation in the timing will affect the timing of the operation circuit connected to this pipeline register circuit. In the worst case, the timing of the operation circuit connected to this pipeline register circuit may greatly differ depending on a comparison result, so that operation of the semiconductor integrated circuit as a whole may differ according to the comparison result.

On the contrast therewith, in the semiconductor integrated circuit according to the present invention, it is determined in advance which one of the output signals of the first and second storage circuits is to be output from the pipeline register circuit. For this reason, the timing of the operation circuit connected to this pipeline register circuit is not affected, irrespective of the comparison result.

A pipeline register circuit in the semiconductor integrated circuit according to the present invention includes means for storing the location of a failure when the determination circuit in the failure prediction circuit predicts the failure.

For example, information on the failure is collected in a specific location in a chip through a scan path that makes serial connection between pipeline registers, and which failure prediction circuit in the chip has predicted the failure is stored in the specific location in the chip. With this arrangement, the location where the failure has occurred is specified. Failure analysis of the chip returned from a user on a manufacturer side, for example, is thereby facilitated. A nonvolatile memory or the like may be employed as the means for storing the location of the failure.

A semiconductor integrated circuit according to the present invention may be so reconfigured that two or more operation circuits having a same function are included in each pipeline stage, and when a determination circuit of a failure prediction circuit predicts a failure, another spare operation circuit operates.

In a semiconductor integrated circuit according to the present invention, each of operation circuits having a same function may be divided. With this arrangement, when a failure is predicted, and a spare operation circuit is operated, the probability of occurrence of a failure in the spare operation circuit can be reduced.

For this reason, even if a transistor or a wiring that constitutes the semiconductor integrated circuit has been degraded due to secular change or the like, influence of the degradation can be minimized. As a result, it can be constantly so arranged that performance deterioration does not occur in terms of both speed and power, for example. A description will be given below in connection with exemplary embodiments.

Exemplary Embodiments

FIG. 1 is a diagram showing a configuration of an exemplary embodiment of the present invention. Referring to FIG. 1, in a synchronous circuit including a plurality of pipeline register circuits 110 and a plurality of operation circuits 111, the operation circuits 111 executes pipeline execution of a predetermined operation in synchronization with a clock signal received through a clock line 203.

"Pipeline execution" is defined as a process in which, in one clock cycle, an operation by each operation circuit sandwiched between the pipeline register circuits 110 is completed and a result of the operation is supplied to the operation circuit in a subsequent stage, and the operation and supply of the operation result performed in the one clock cycle are repeated for each clock cycle, thereby performing a predetermined operation as a whole.

Figure 2:
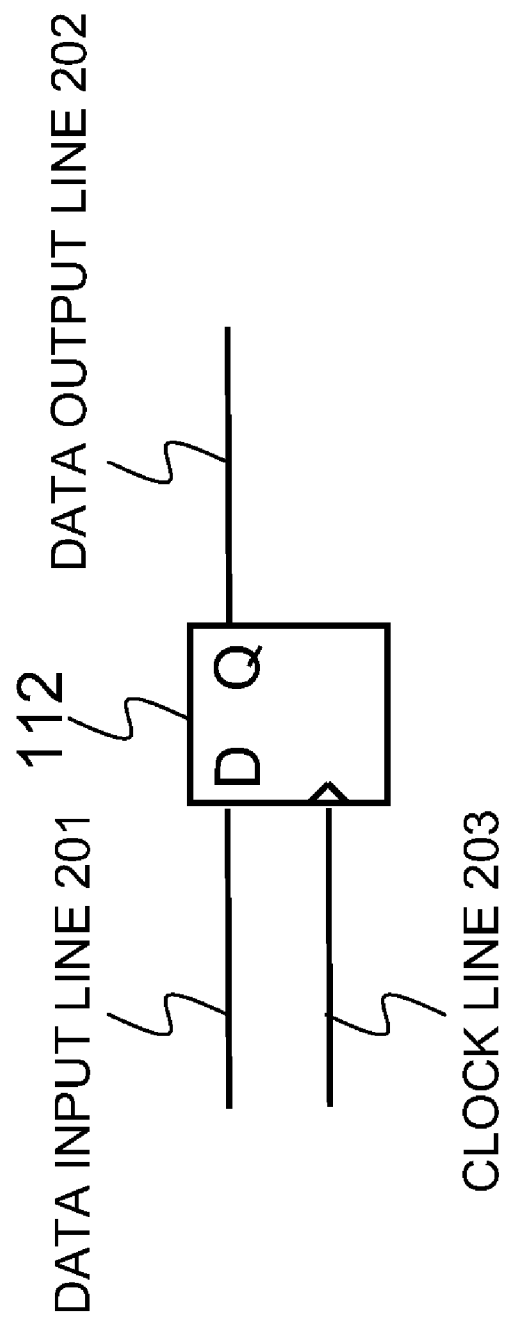
FIG. 2 is a diagram showing a flip-flop circuit.

For each pipeline register circuit 110, a flip-flop circuit shown in FIG. 2, for example, is employed. In the flip-flop circuit 112, a data input terminal D is connected to a data input line 201, a data output terminal Q is connected to a data output line 202, and a clock input terminal is connected to a clock line 203. The flip-flop circuit 112 stores (samples) the logic level of the data input line 201 when the logic level of the clock line 203 is changed from a low (LOW) level to a high (HIGH) level, and outputs the value of the logic level (sample value) to the data output line 202. Referring to FIG. 2, when the data input line receives data composed of a plurality of bits, a plurality of the flip-flops 112 with the clock line 203 made common thereto are provided.

Figure 3:
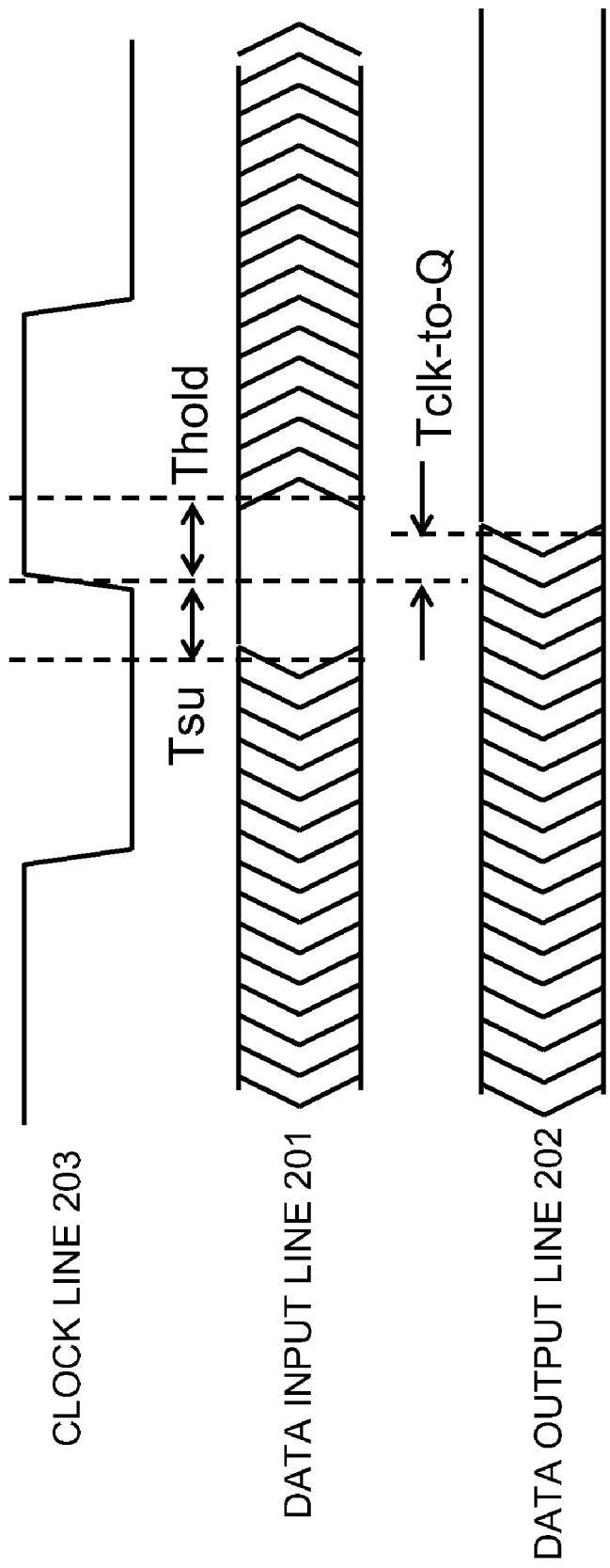
FIG. 3 is a diagram showing operation timings of the flip-flop circuit.

In order to ensure correct latch of data by the flip-flop circuit or a latch, before and after a time when the logic level of the clock line 203 is changed from the low level to the high level, there is a time interval in which the logic level of the data input line 201 must not be changed. As shown in FIG. 3, this time is referred to as a setup time Tsu and a hold time Thold. Assume that the flip-flop circuit samples data at a rising edge of the clock. Then, the setup time is a time in which the logic level of the data input line 201 must be determined before the logic level of the clock line 203 is changed from the low level to the high level (an effective edge). The hold time is a period during which the logic level of the data input line 201 must be held after the logic level of the clock line 203 is changed from the low level to the high level (the effective edge).

A delay time Tclk-to-Q is a time from when the logic level of the clock line 203 is changed from the low level to the high level to when the logic level (sampled value) of the data input line 201 is output to the data output line 202 through the data output terminal Q of the flip-flop circuit.

Figure 4:
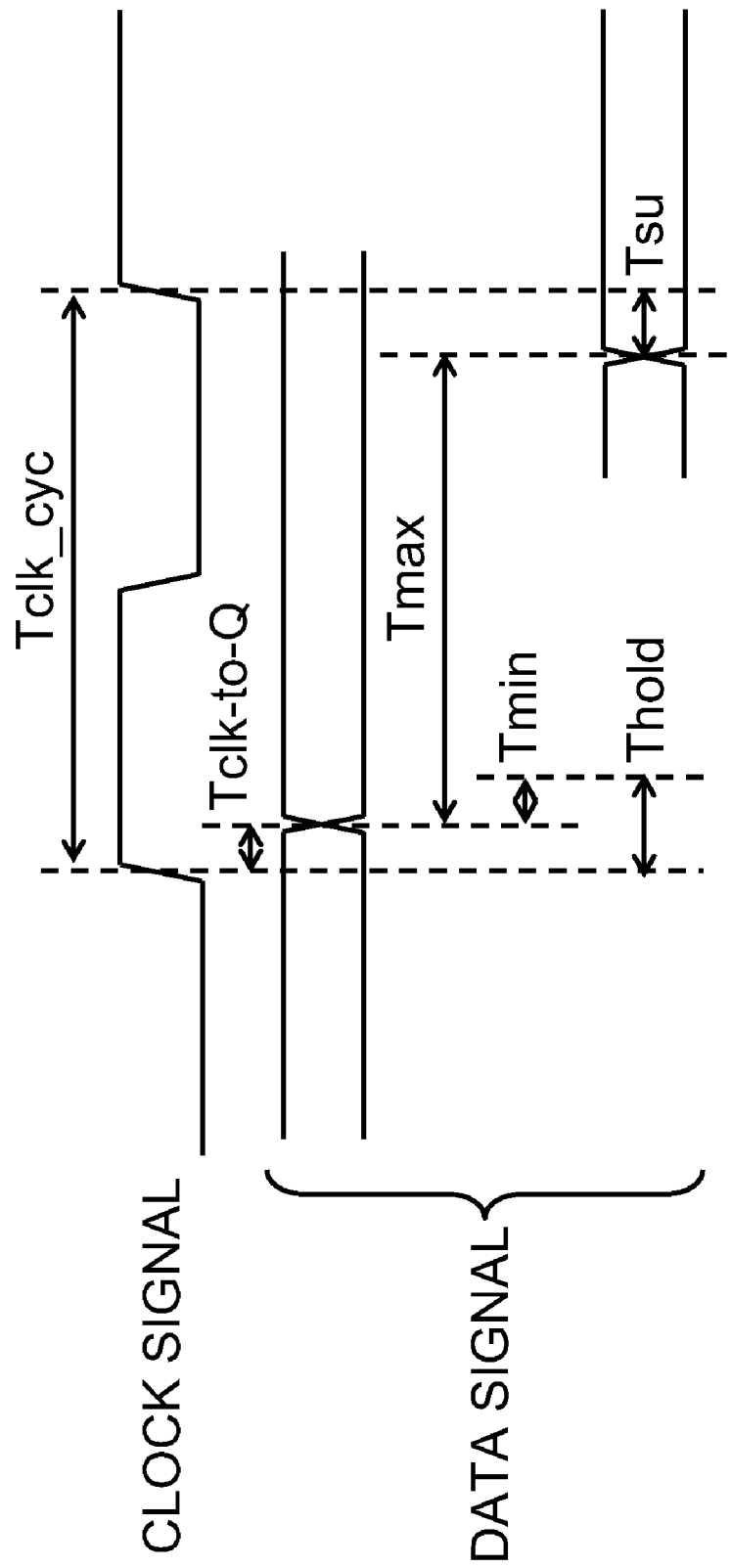
FIG. 4 is a diagram showing operation timings of a synchronous circuit.

Referring to FIG. 4, a maximum value Tmax requested for the delay time of the operation circuit 111 of the synchronous circuit in FIG. 1 is obtained by subtracting the delay time Tclk-to-Q and the setup time Tsu from a clock cycle Tclk-_cyc. A minimum Tmin requested for the delay time is obtained by subtracting the delay time Tclk-to-Q from the hold time Thold. When the value obtained from the subtraction is negative, the minimum value of the delay time of the operation circuit 111 does not exist and may be set to zero. In an ordinary flip-flop circuit, this minimum value may be regarded as zero. When this flip-flop circuit is used in this case, the synchronous circuit normally operates just by cascading the pipeline register circuits with the operation circuits eliminated, for example.

It is necessary to design the delay time of the operation circuit 111 in the synchronous circuit to be between the maximum value Tmax and the minimum value Tmin.

The larger the maximum value Tmax requested for the delay time is, the more complicated operation can be performed by the operation circuit 111. On the other hand, the smaller the minimum value Tmin requested for the delay time is, the need for giving a needless delay to the arithmetic operation is eliminated. Thus, there is an advantage that the area of a delay circuit and power consumption can be reduced. In other words, the smaller the delay time Tclk-to-Q, the setup time Tsetup, and the hold time Thold are, the better performance the flip-flop circuit has.

First Exemplary Embodiment

Figure 5:
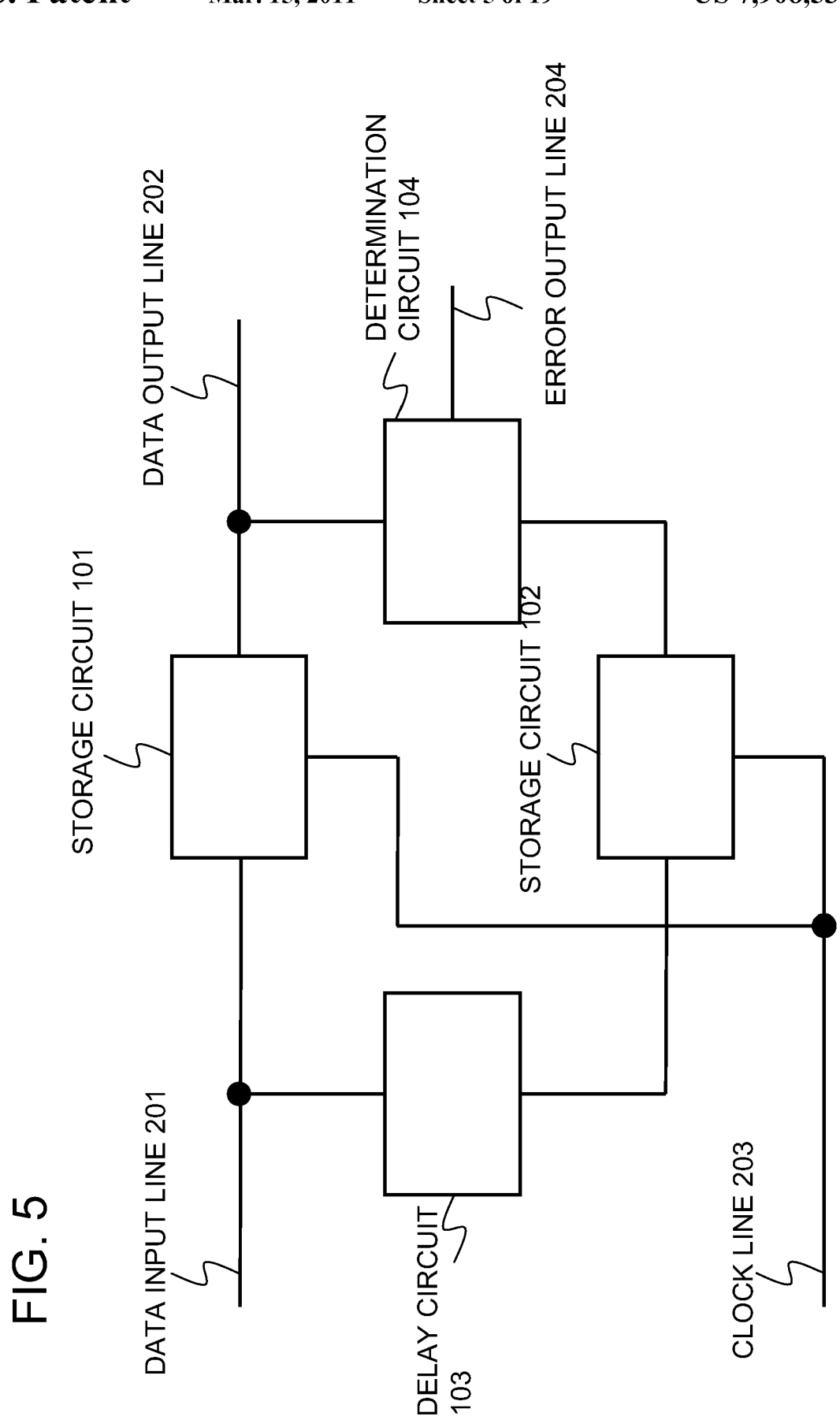
FIG. 5 is a diagram showing a configuration of a first exemplary embodiment of the present invention.

FIG. 5 is a diagram showing a configuration of a pipeline register circuit in a first exemplary embodiment of the present invention. As shown in FIG. 5, in the pipeline register circuit, a delay circuit 103 is connected to a data input line 201. The pipeline register circuit then includes a first storage circuit 101 and a second storage circuit 102 that respectively store therein logic levels of an input and an output of the delay circuit 103 when the logic level of a clock line 203 is changed, and a determination circuit 104 that determines whether or not results from the first storage circuit 101 and the second storage circuit 102 are the same.

Each of the first storage circuit 101 and the second storage circuit 102 may be formed of an ordinary flip-flop circuit 112 that reads in the logic level of a data line when the logic level of a clock line is changed from a low level to a high level, and outputs the read-in logic level to an output line.

The logic level of the same data line is read in at a time separated just by the delay time of the delay circuit 103, and the determination circuit 104 determines whether or not the values of the logic levels are the same.

The delay circuit 103 may be formed of an ordinary inverter circuit, for example. The determination circuit 104 may be formed of a coincidence detection circuit such as an ordinary EXOR (exclusive OR) circuit or the like, for example.

Figure 6:
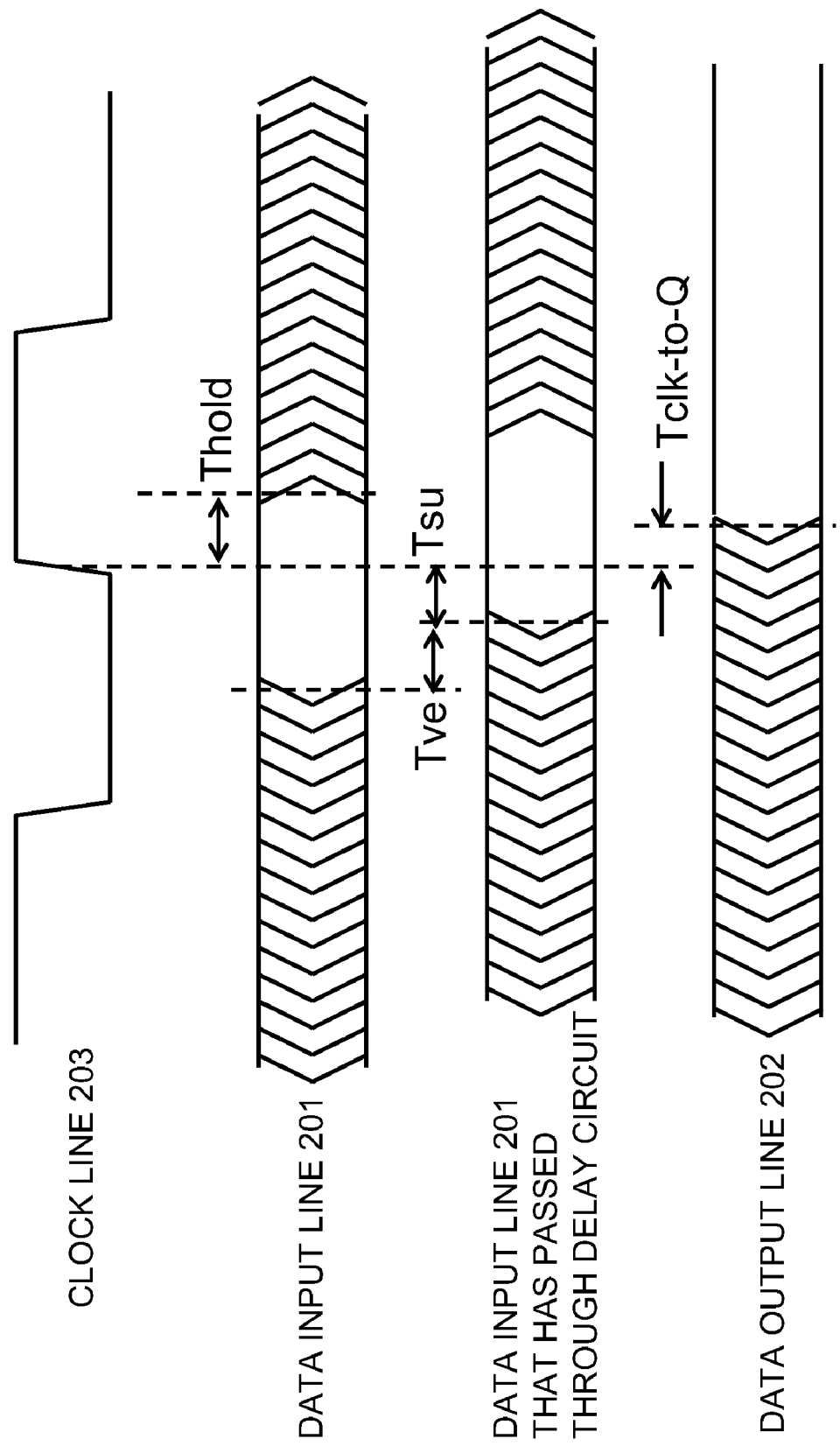
FIG. 6 is a diagram showing operation timings of the first exemplary embodiment of the present invention.

FIG. 6 is a timing diagram showing an operation example of the configuration in FIG. 5. When the setup time, hold time, and delay time of the flip-flop circuit are respectively designated by Tsu, Thold, and Tclk-to-Q, a setup time in the first exemplary embodiment is given by the sum of the setup time Tsu and a delay time Tve of the delay circuit 103, a hold time in the first exemplary embodiment is given by the hold time Thold, and a delay time in the first exemplary embodiment is given by the delay time Tclk-to-Q.

When the maximum value of the delay time of an operation circuit is sufficiently short, outputs of the first storage circuit 101 and the second storage circuit 102 assume a same value.

However, due to a secular change of a transistor or a wiring that constitutes the operation circuit, the delay of the operation circuit increases. Then, when the delay time assumes a value between Tclk_cyc—Tclk-to-Q—Tsu—Tve and Tclk-_cyc—Tclk-to-Q—Tsu, different values are held in the first storage circuit 101 and the second storage circuit 102, respectively. It is because the first storage circuit 101 can hold a result of operation by the operation circuit, but the second storage circuit 102 holds the value in the course of the operation, and cannot hold the final operation result of the operation circuit.

When the different values are held in the first storage circuit 101 and the second storage circuit 102, the determination circuit 104 outputs the above state as an error through an error output line 204. On the other hand, the value of the first storage circuit 101 in which the correct result of the operation is held is output to the data output line 202.

In this manner, in the pipeline register circuit according to the present invention, when an anomaly or a failure is present in the operation circuit and the delay time of the operation circuit has increased, an error can be detected before the error occurs (before the delay time exceeds a clock cycle time). A case where a transistor or a wiring that constitutes the semiconductor integrated circuit has been degraded due to the secular change or stress, a case where a line that should not be originally connected is connected in a high resistive state due to presence of dust between wirings, or a case where a wiring interval is abnormally close and a line that should not be originally connected is therefore connected with a high capacity may be regarded as the anomaly or the failure.

Now, assume that the delay time of the operation circuit has increased due to the failure or the like. Then, it may be considered that data held later in time is correct, and data held earlier in time is incorrect.

The storage circuit 101 references data through the data input line 201 later than the storage circuit 102. Thus, when data held in the storage circuit 101 and the storage circuit 102 are different, data in the storage circuit 101 is correct, and data in the storage circuit 102 is incorrect.

Since the data output line 202 is connected to the storage circuit 101 in which the correct data is held, the operation circuit in the subsequent stage of the pipeline register circuit does not start operation using the incorrect data.

The hold time in this exemplary embodiment assumes the value Thold which is the same as the ordinary flip-flop circuit that constitutes the storage circuit 101. As described above, the minimum value requested for the delay time of the operation circuit can be set to zero. This exemplary embodiment may include a latch circuit (not shown) that stores a comparison result by a determination circuit 104. When an output of the storage circuit 101 is not the same as an output of the storage circuit, the latch circuit may latch a determination result by the determination circuit 104.

Second Exemplary Embodiment

Figure 7:
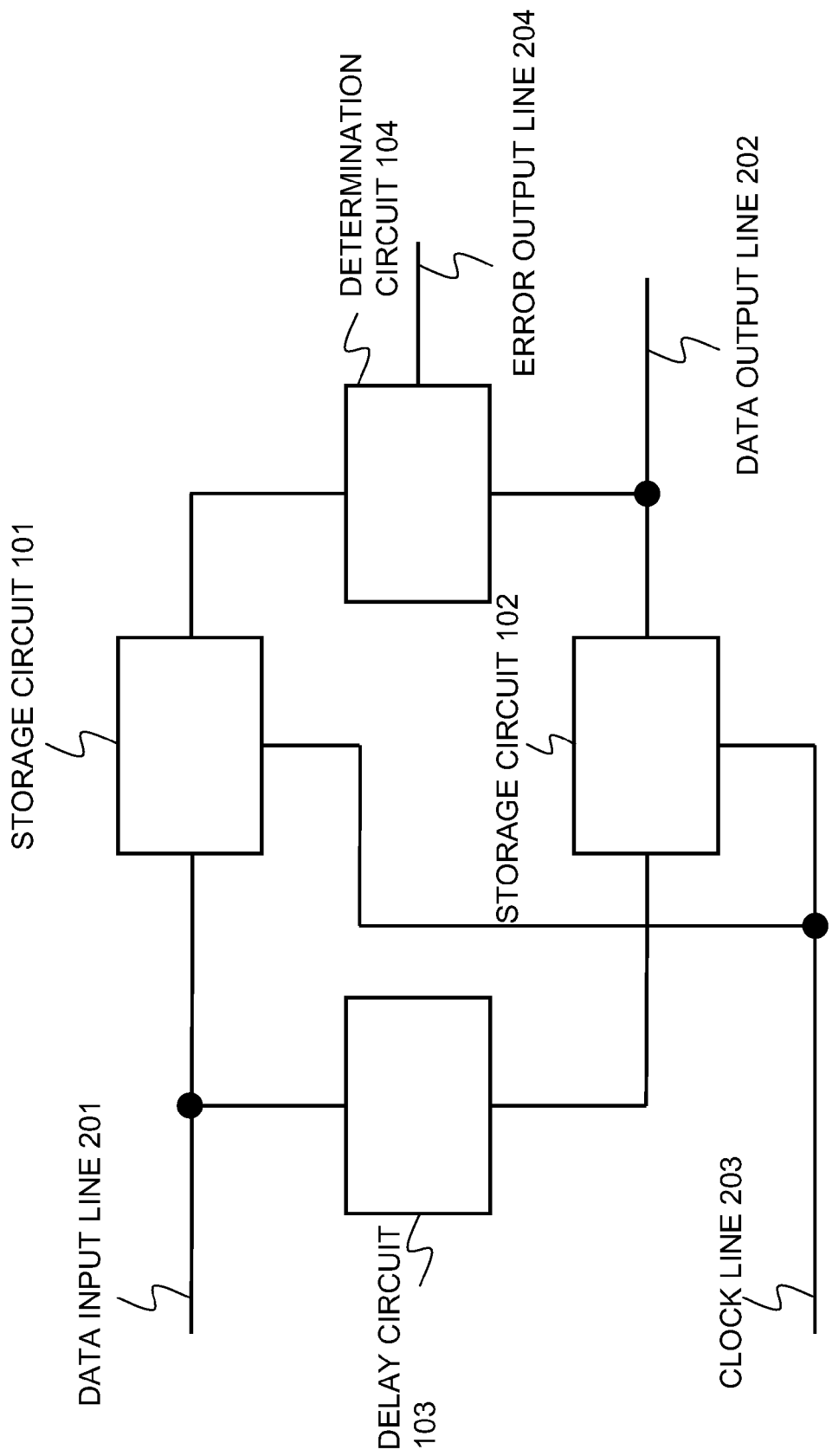
FIG. 7 is a diagram showing a configuration of a second exemplary embodiment of the present invention.

FIG. 7 is a diagram showing a configuration of a pipeline register circuit according to a second exemplary embodiment of the present invention. A data output line 202 is obtained from an output of a second storage circuit 102 in this exemplary embodiment, which is different from the first exemplary embodiment. For this reason, in the second exemplary embodiment, a value of the second storage circuit 102 in which an incorrect operation result is held is output to the data output line 202.

In this exemplary embodiment, operation timings are shown in FIG. 6, as in the first exemplary embodiment.

When the setup time, hold time, and delay time of a flip-flop circuit are respectively indicated by Tsu, Thold, and Tclk-to-Q, in the second exemplary embodiment of the present invention, a setup time is given by the sum of the setup time Tsu and a delay time Tve of a delay circuit 103, a hold time is given by the hold time Thold, and a delay time is given by the delay time Tclk-to-Q.

When the delay time of an operation circuit 111 is increased due to a secular change of a transistor or a wiring that constitutes the operation circuit 111, the pipeline register circuit in this exemplary embodiment can detect an error before the error occurs.

The hold time in this exemplary embodiment is the same as the hold time Thold of the ordinary flip-flop circuit that constitutes a storage circuit 101. Thus, as described above, the minimum value requested for the delay time of the operation circuit can be set to zero. This exemplary embodiment may also include a latch circuit (not shown) that stores a comparison result by a determination circuit 104. When an output of the storage circuit 101 is not the same as an output of the storage circuit 102, the latch circuit may latch a determination result by the determination circuit 104.

Third Exemplary Embodiment

Figure 8:
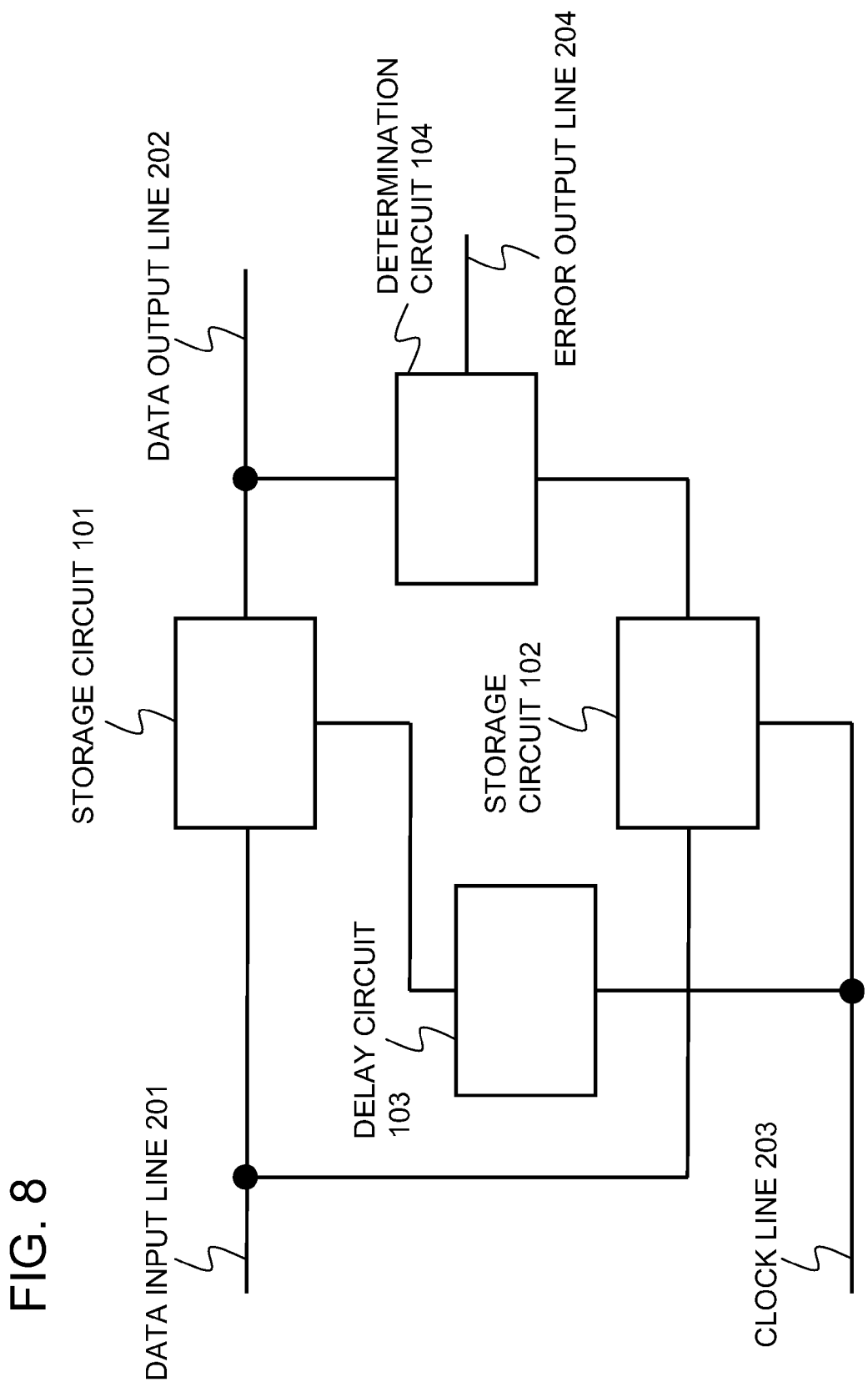
FIG. 8 is a diagram showing a configuration of a third exemplary embodiment of the present invention.

FIG. 8 is a diagram showing a configuration of a pipeline register circuit in a third exemplary embodiment of the present invention. As shown in FIG. 8, a delay circuit 103 is connected to a clock line 203. Then, this exemplary embodiment includes two storage circuits constituted from a first storage circuit 101 and a second storage circuit 102 that store logic levels of a data input line 201 when the logic level of the clock line 203 or the output line of the delay circuit 103 is changed, and a determination circuit 104 that determines whether or not results of the first and second storage circuits are the same.

Each of the storage circuits 101 and 102 may be an ordinary flip-flop circuit 112 that reads the logic level of a data line when the logic level of a clock line is changed from a low level to a high level and outputs the read-in logic level to an output line, for example.

The logic level of the same data line is read in at a time separated just by the delay time of the delay circuit 103, and the determination circuit 104 determines whether or not the read-in value is the same as the value of the logic level of the data line read in by the storage circuit 101.

For example, the delay circuit 103 may be formed of an ordinary inverter circuit, and the determination circuit 104 may be formed of an ordinary EXOR circuit, for example.

Figure 9:
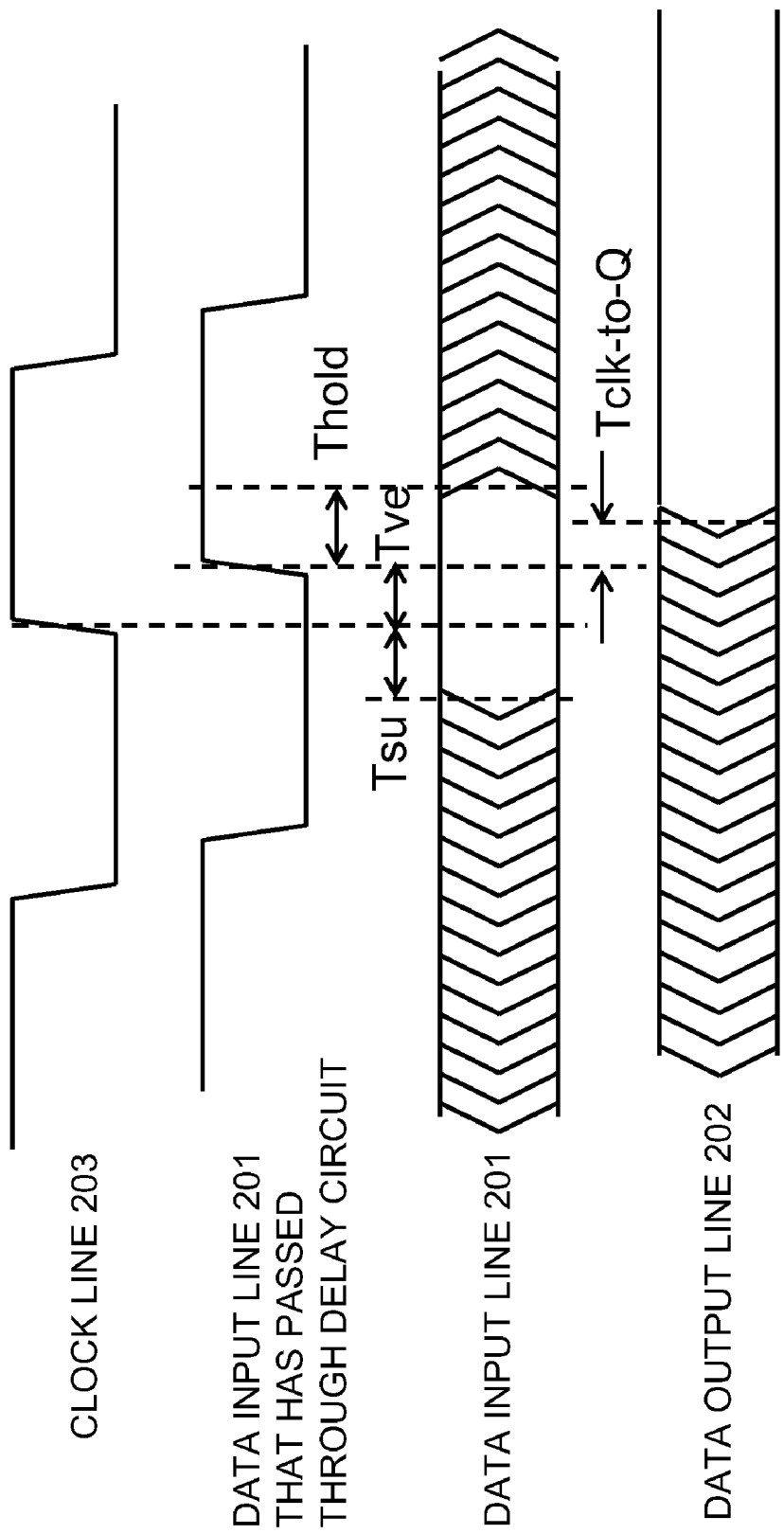
FIG. 9 is a diagram showing operation timings of the third exemplary embodiment of the present invention.

FIG. 9 is a diagram showing operation timings in the third exemplary embodiment of the present invention. In the third exemplary embodiment of the present invention, when the setup time, hold time, and delay time of the flip-flop circuit are respectively indicated by Tsu, Thold, and Tclk-to-Q, a setup time is given by Tsu, a hold time is given by the sum of the hold time Thold and a delay time Tve of the delay circuit 103, and a delay time is given by the sum of the delay time Tclk-to-Q and the delay time Tve.

When the maximum value of the delay time of an operation circuit is sufficiently short, outputs of the first storage circuit 101 and the second storage circuit 102 assume a same value. However, the delay time of the operation circuit increases due to a secular change of a transistor or a wiring that constitutes the operation circuit. Then, when the delay time of the operation circuit assumes a value between values Tclk_cyc—Tclk-to-Q—Tsu—Tve and Tclk_cyc—Tclk-to-Q—Tsu, different values are held in the first storage circuit 101 and the second storage circuit 102, respectively. It is because the first storage circuit 101 can hold a result of operation of the operation circuit, but the second storage circuit 102 holds a value in the course of the operation, and cannot hold the final operation result of the operation circuit.

When the different values are held in the first storage circuit 101 and the second storage circuit 102, the determination circuit 104 outputs the above state as an error through an error output line 204. On the other hand, the value of the first storage circuit 101 in which the correct operation result is held is output to a data output line 202.

In this manner, in the pipeline register circuit in this exemplary embodiment, when an anomaly or a failure is present in the operation circuit and the delay time of the operation circuit has increased, an error can be detected before the error occurs (before the delay time exceeds a clock cycle time). A case where a transistor or a wiring that constitutes the semiconductor integrated circuit has been degraded due to the secular change or stress, a case where a wiring that should not be originally connected is connected in a high resistive state due to presence of dust or the like between wirings, or a case where a wiring interval is abnormally close and a wiring that should not be originally connected is connected with a high capacity can be pointed out as the anomaly or the failure.

Now, assume that the delay time of the operation circuit has increased due to the failure or the like. Then, it may be considered that data held later in time is correct, and data held earlier in time is incorrect.

The storage circuit 101 references data through the data input line 201 later than the storage circuit 102. Thus, when data held in the storage circuit 101 and the storage circuit 102 are different, data in the storage circuit 101 is correct, and data in the storage circuit 102 is incorrect.

Since the data output line 202 is connected to the storage circuit 101 in which the correct data is held, the operation circuit in the subsequent stage of the pipeline register circuit does not start an operation using the incorrect data.

The hold time in this exemplary embodiment is obtained by increasing the hold time Thold of the ordinary flip-flop circuit that constitutes the storage circuit 101 just by the delay time Tve of the delay circuit 103. The delay time is also increased by the delay time Tve of the delay circuit 103. Thus, the minimum value requested for the delay time of the operation circuit remains unchanged, and can be set to zero. This exemplary embodiment may also include a latch circuit (not shown) that stores a comparison result by the determination circuit 104. When an output of the storage circuit 101 is not the same as an output of the storage circuit 102, the latch circuit may latch a determination result by the determination circuit 104.

Fourth Exemplary Embodiment

Figure 10:
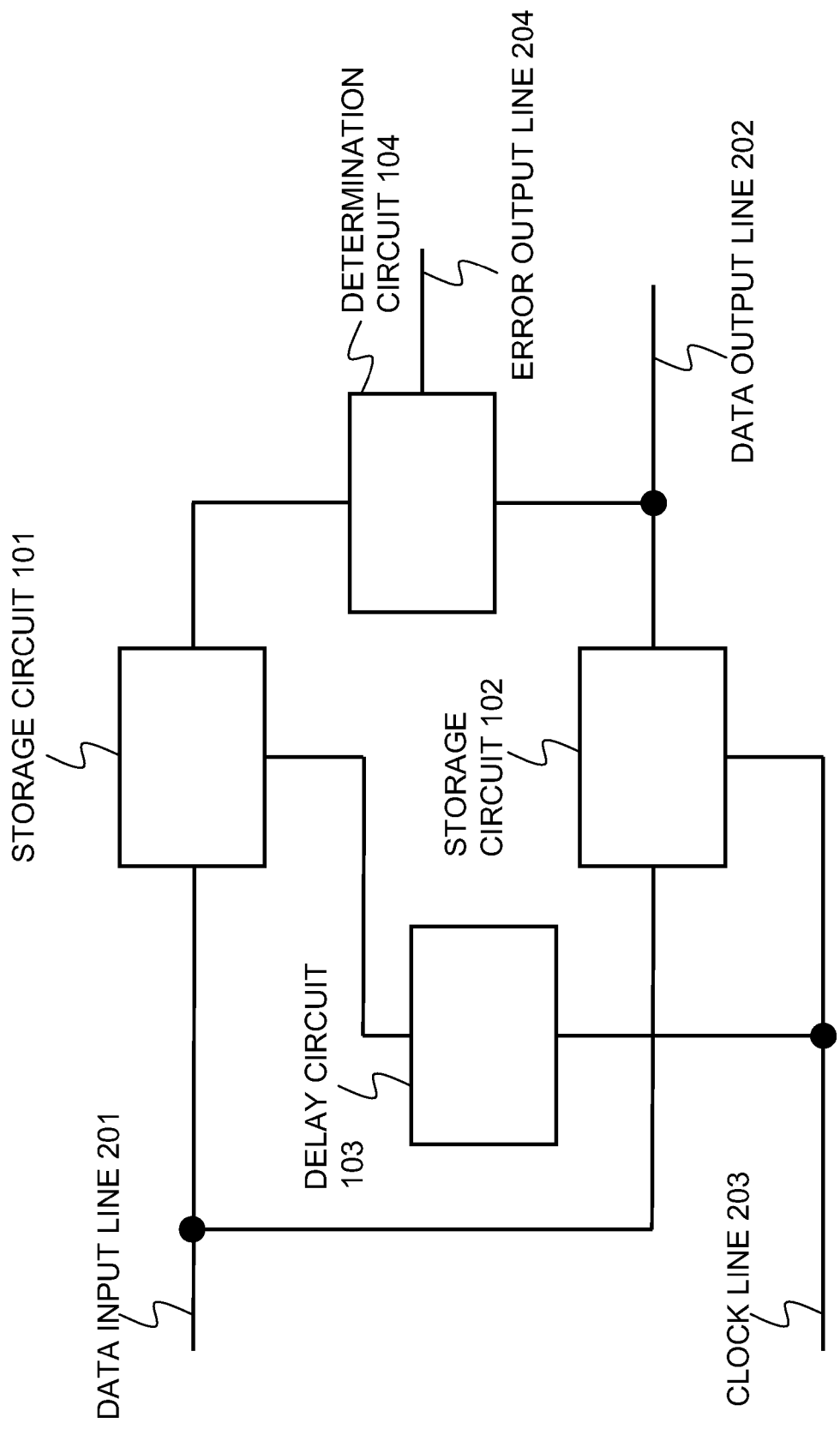
FIG. 10 is a diagram showing a configuration of a fourth exemplary embodiment of the present invention.

FIG. 10 is a diagram showing a configuration of a pipeline register circuit according to a fourth exemplary embodiment of the present invention. Referring to FIG. 10, in this exemplary embodiment, a data output line 202 is obtained from an output of a second storage circuit 102, which is different from the third exemplary embodiment. Accordingly, in this exemplary embodiment, a value of the second storage circuit 102 in which an incorrect operation result is held is output to the data output line 202.

Figure 11:
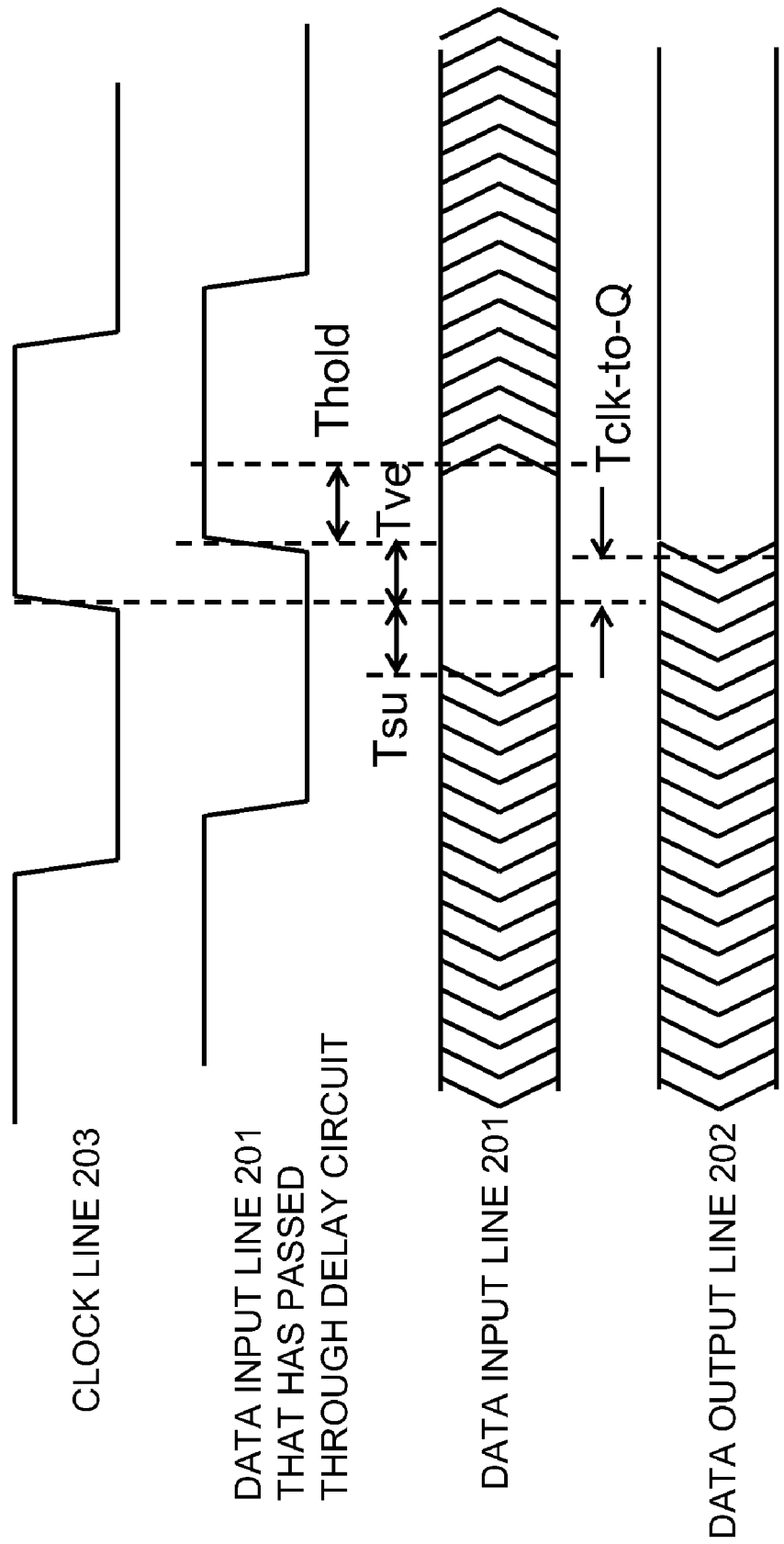
FIG. 11 is a diagram showing operation timings of the fourth exemplary embodiment of the present invention.

FIG. 11 is a timing diagram showing operations in the fourth exemplary embodiment of the present invention. When the setup time, hold time, and delay time of a flip-flop circuit are respectively indicated by Tsu, Thold, and Tclk-to-Q, in the fourth exemplary embodiment of the present invention, a setup time is given by the setup time Tsu, a hold time is given by the sum of the hold time Thold and a delay time Tve of a delay circuit 103, and a delay time is given by the delay time Tclk-to-Q.

In this manner, when the delay time of an operation circuit is increased due to a secular change of a transistor or a wiring that constitutes the operation circuit in the pipeline register circuit according to the present invention, the pipeline register circuit can detect an error before the error occurs.

In this exemplary embodiment, the hold time is increased from the hold time Thold of the ordinary flip-flop circuit that constitutes a storage circuit 101 just by the delay time Tve of the delay circuit 103.

Assume that the oscillation cycle of a clock signal is indicated by Tcyc. Then, by setting the delay time of the delay circuit 103 to Tcyc-Tve in the third exemplary embodiment, the same effect as that when the delay time of the delay circuit 103 is set to Tve in the fourth exemplary embodiment can be obtained.

Likewise, by setting the delay time of the delay circuit 103 to Tcyc-Tve in the fourth exemplary embodiment of the present invention, the same effect as that when the delay time of the delay circuit 103 is set to Tve in the third exemplary embodiment can be obtained. The fourth exemplary embodiment may also include a latch circuit (not shown) that stores a comparison result by a determination circuit 104. When an output of the storage circuit 101 is not the same as an output of the storage circuit 102, the latch circuit may latch a determination result by the determination circuit 104.

By allowing a change in the delay time of the delay circuit 103 in the first through fourth exemplary embodiment even after semiconductor manufacture, the delay time of the delay circuit 103 can be increased in an application where reliability is demanded in particular, for example, and an anomaly or a failure can be detected before the anomaly or the failure occurs.

By adjusting the delay time after the semiconductor manufacture, a change in performance of the semiconductor integrated circuit depending on variations in the semiconductor fabrication, temperature, or power supply voltage can also be prevented.

Fifth Exemplary Embodiment

Figure 12:
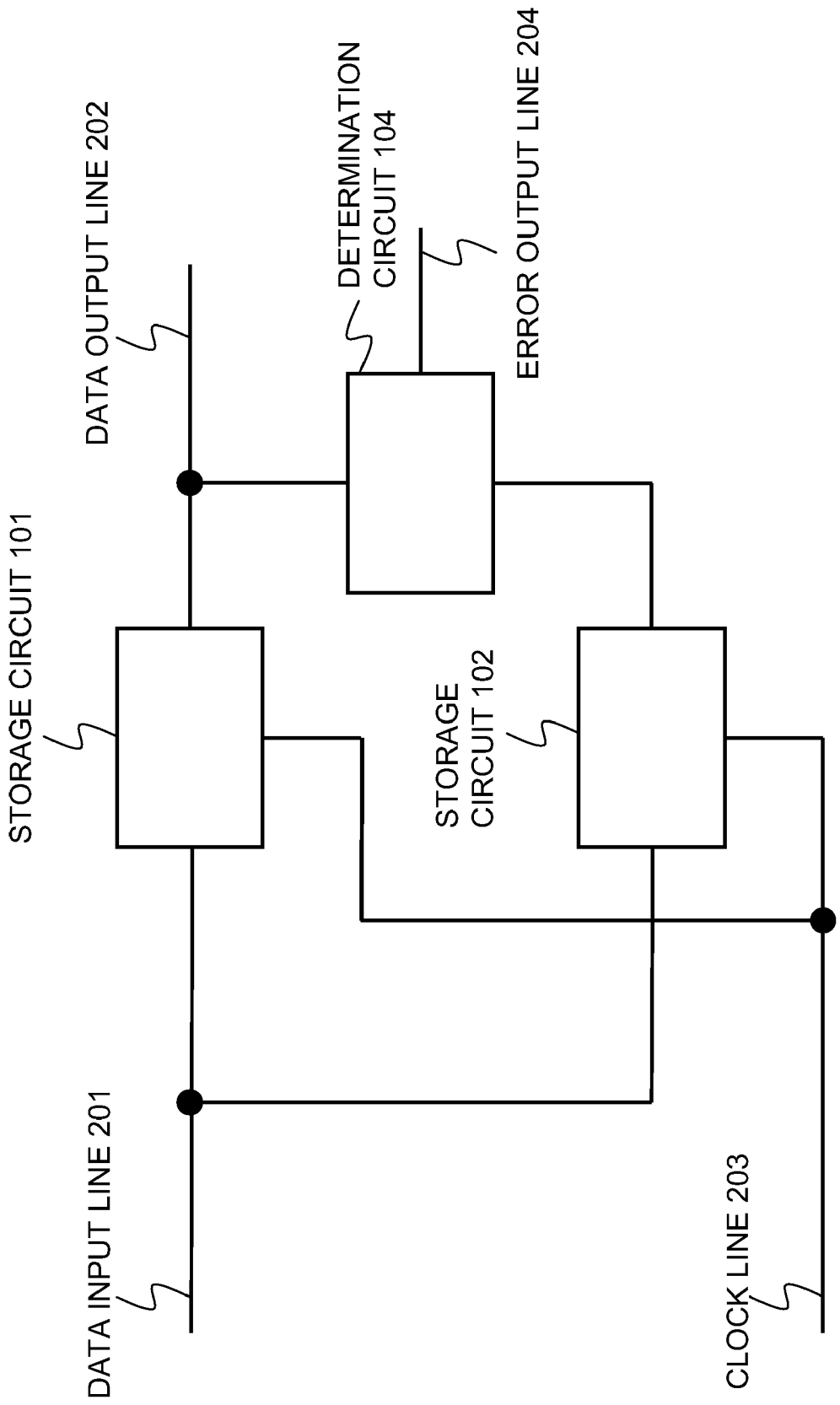
FIG. 12 is a diagram showing a configuration of fifth and sixth exemplary embodiments of the present invention.

FIG. 12 is a diagram showing a configuration of a pipeline register circuit according to a fifth exemplary embodiment of the present invention. As shown in FIG. 12, in this exemplary embodiment, there are provided two storage circuits constituted from a first storage circuit 101 and a second storage circuit 102 that store logic levels of a data input line 201 when the logic level of a clock line 203 is changed, and a determination circuit 104 that determines whether or not results of the first and second storage circuits are the same.

Each of the storage circuits 101 and 102 may be an ordinary flip-flop circuit 112 that reads in the logic level of a data line when the logic level of a clock line is changed from a low level to a high level and outputs the read-in logic level to an output line, for example. One of input logic thresholds of input signals (data inputs or clock inputs) to flip-flop circuits used for the first storage circuit 101 and the second storage circuit 102 is set to be high, and the other of the input logic thresholds is set to be low.

In the fifth exemplary embodiment of the present invention, the logic thresholds of the clock inputs to the flip-flop circuits are adjusted. In this case, the same clock inputs are supplied to the first storage circuit 101 and the second storage circuit 102. Then, data are stored at timings that are a little different.

Sixth Exemplary Embodiment

In a sixth exemplary embodiment of the present invention, logic thresholds of data inputs to flip-flop circuits are adjusted. In this case, the same data inputs are supplied to a first storage circuit 101 and a second storage circuit 102. When signal potentials of the data inputs are still transitioning at a time of a change in the logic level of a clock line from low to high, the first and second storage circuit output different logical values. In both of the fifth and sixth exemplary embodiments as well, a determination circuit 104 determines whether or not logical values of outputs of the first and second storage circuits are the same. The determination circuit 104 can be formed of an ordinary EXOR circuit, for example.

In both of the fifth and sixth exemplary embodiments, when the maximum delay time of an operation circuit is sufficiently short, the potential level of a signal supplied through the data input line is sufficiently stable. Thus, outputs of the first storage circuit 101 and the second storage circuit 102 assume the same value. However, when the maximum delay time of the operation circuit is increased and the potential level of the signal supplied through the data input line is not sufficiently stable at a time of a change in the logic level of the clock line from low to high, different values are held in the first storage circuit 101 and the second storage circuit 102.

When the different values are held in the first storage circuit 101 and the second storage circuit 102, the determination circuit 104 outputs the above state as an error through an error output line 204.

In this manner, when the delay time of the operation circuit is increased due to a secular change of a transistor or a wiring that constitutes the operation circuit in the pipeline register circuit according to the present invention, the pipeline register circuit in this exemplary embodiment can detect an error before the error occurs. Each of the fifth and sixth exemplary embodiments may include a latch circuit (not shown) that stores a comparison result by the determination circuit 104. When outputs of the storage circuit 101 and the storage circuit 102 are not the same, the latch circuit may latch a determination result by the determination circuit 104.

It should be noted that the first exemplary embodiment and the third exemplary embodiment can be simultaneously applied. The delay circuit can be connected to the data input line of the storage circuit 102, and the delay circuit can be connected to the clock input line of the storage circuit 101. In this case as well, the same effect as that in the first and third exemplary embodiments can be obtained.

Alternatively, the second exemplary embodiment and the fourth exemplary embodiment can be simultaneously applied. The delay circuit can be connected to the data input line of the storage circuit 101, and the delay circuit can be connected to the clock input line of the storage circuit 102. In this case as well, the same effect at that in the second and fourth exemplary embodiments can be obtained.

Seventh Exemplary Embodiment

Figure 13:
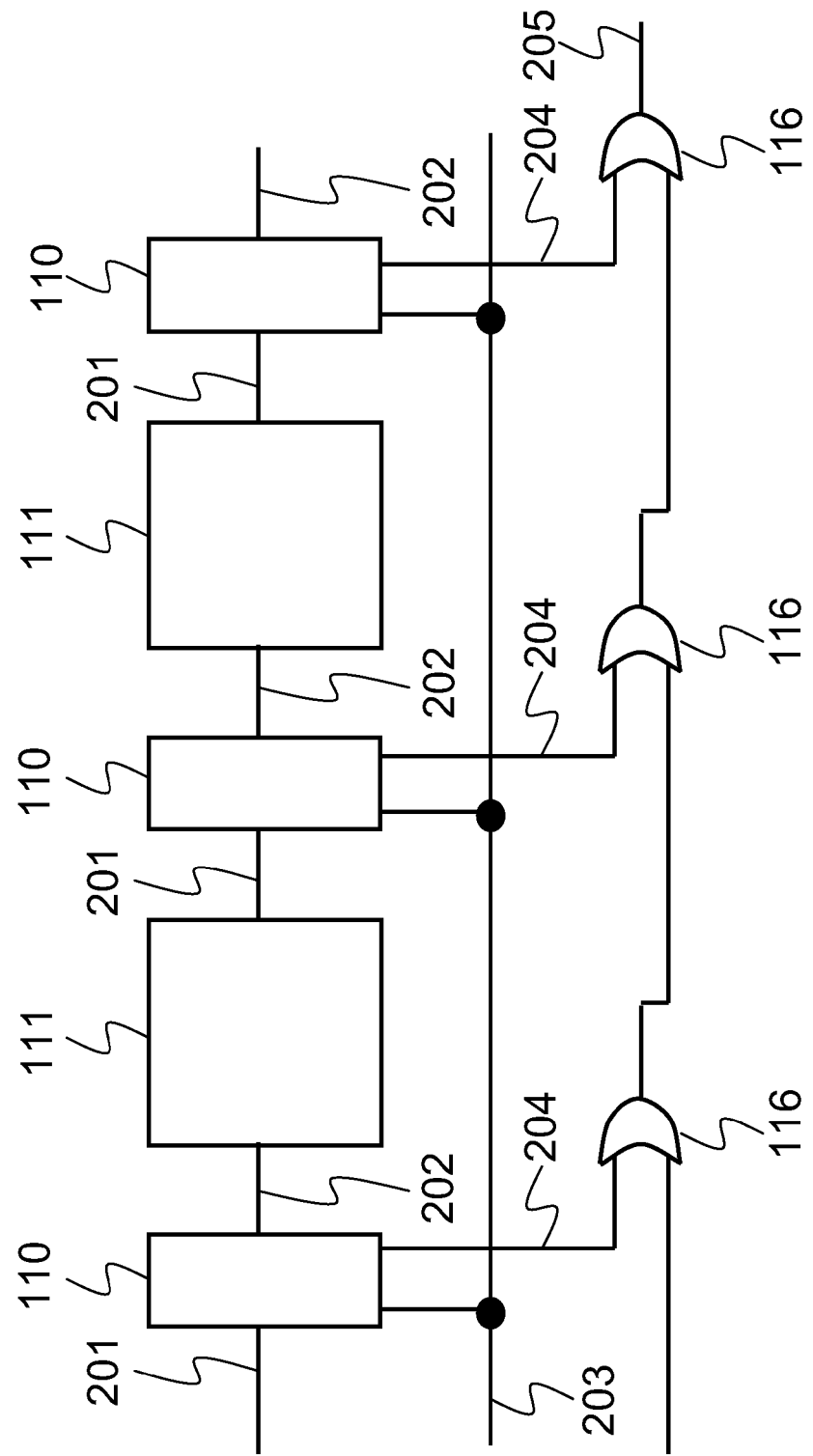
FIG. 13 is a diagram showing a configuration of a seventh exemplary embodiment of the present invention.

FIG. 13 is a diagram showing a configuration of a semiconductor integrated circuit in a seventh exemplary embodiment of the present invention. In this exemplary embodiment, a synchronous circuit is formed in which the pipeline register circuits 110 in one of the first through sixth exemplary embodiments are used, and operation circuits 111 are inserted between the pipeline register circuits 110.

In this exemplary embodiment, the error output lines 204 of the pipeline register circuits in one of the first through sixth exemplary embodiments are connected, using OR circuits 116.

In this exemplary embodiment, when performance of a transistor or a wiring that constitutes one of the operation circuits 111 has been degraded due to secular change in this exemplary embodiment, and when the delay time of the one of the operation circuits 111 in FIG. 13 is then increased to cause a malfunction, a corresponding one of the pipeline register circuit 110 detects this state, and outputs the state through an error output line 205. This output can be stored in a non-volatile memory within the chip, can be reported outside the chip, can be notified to other logic circuit inside the chip, or can be notified to an MPU inside the chip in the form of an interrupt, for example.

When the performance of a transistor or a wiring that constitutes one of the operation circuits 111 has been degraded due to secular change in this exemplary embodiment, and the delay time of one of the operation circuits 111 in FIG. 13 is increased to cause a malfunction in this exemplary embodiment, operation of the entire semiconductor integrated circuit may be stopped. Then, data values held in all the pipe registers or in the pipe registers related to the pipe register where the malfunction is likely to occur may be stored and used to identify the cause and location of the malfunction.

Eighth Exemplary Embodiment

Figure 14:
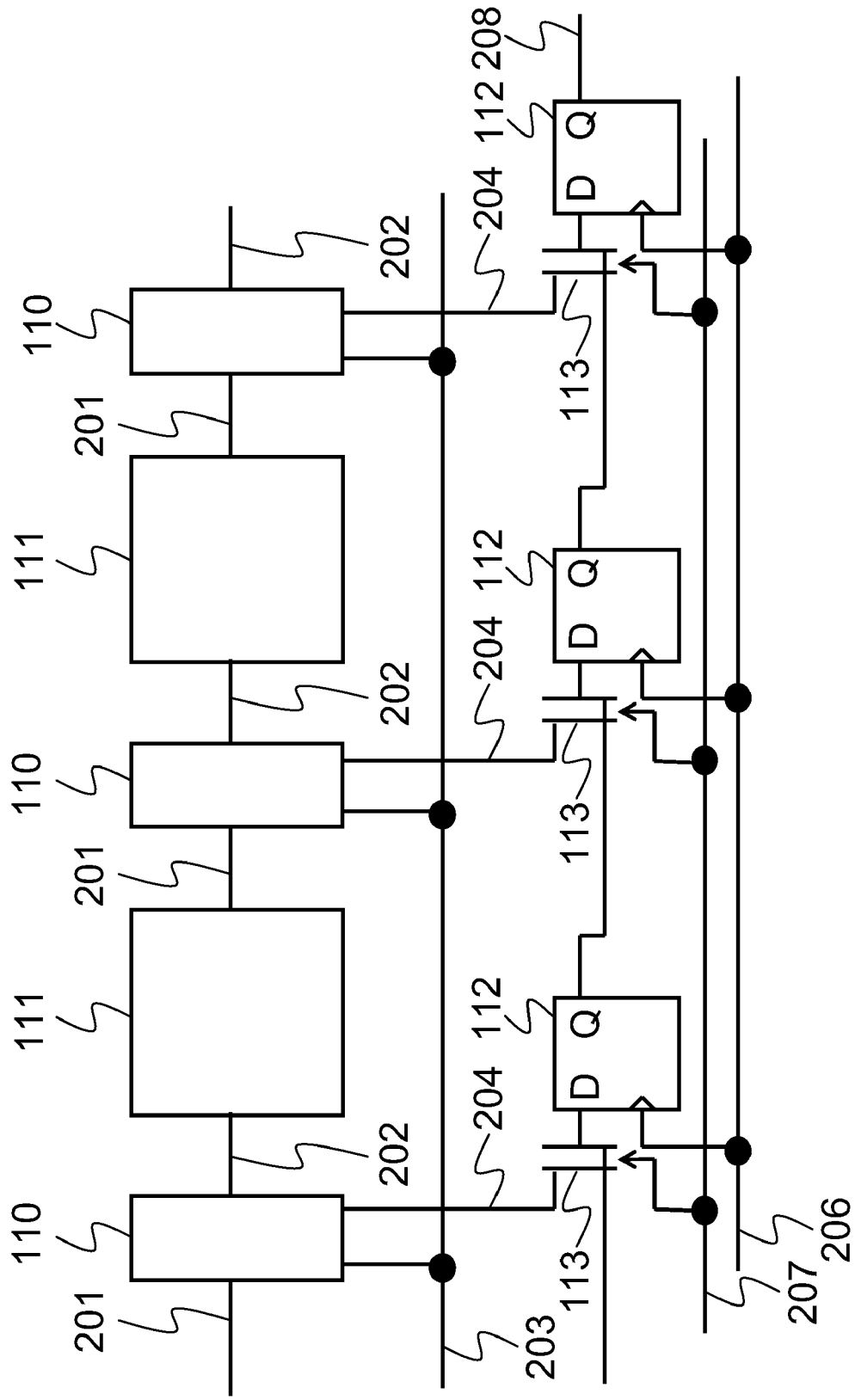
FIG. 14 is a diagram showing a configuration of an eighth exemplary embodiment of the present invention.

FIG. 14 is a diagram showing a configuration of a semiconductor integrated circuit in an eighth exemplary embodiment of the present invention. In this exemplary embodiment, a synchronous circuit is formed in which the pipeline register circuits 110 in one of the first through sixth exemplary embodiments are employed and operation circuits 111 are inserted between the pipeline register circuits 110. An error output line 204 of each of the pipeline register circuit in one of the first through sixth exemplary embodiments is connected, using a flip-flop circuit 112 and a selector circuit 113.

In this exemplary embodiment, when performance of a transistor or a wiring that constitutes one of the operation circuits 111 has been degraded due to secular change, and when the delay time of the one of the operation circuits 111 in FIG. 14 is then increased to cause a malfunction, a corresponding one of the pipeline register circuits 110 in the one of the first through sixth exemplary embodiments detects this state, and outputs the state to each error output line 204. In this case, the semiconductor integrated circuit is configured as follows. A selector circuit 113 is switched using a switching line 207 so as to hold the signal on the error output line 204 by the flip-flop circuit 112. Then, using the selector switching line 207, the selector circuit 113 is switched reversely so as to cascade connect the flip-flop circuits 112. Then, a clock signal is supplied through a clock line 206. Error output line states of the respective pipeline register circuits can be thereby obtained from an output 208 of the flip-flop 112 in a final stage for respective clock cycles, in a sequential order.

In this case, by counting the number of clock cycles until an error output result appears in the output 208, it can be known in which pipeline register circuit the delay of the operation circuit has increased.

In the present invention, aside from the pipeline register circuits, a circuit (scan path circuit) for sequentially outputting error output line states of the respective pipeline register circuits is formed, using the selector circuits and the flip-flop circuits. The scan path circuit can be implemented by using the flip-flop circuits that constitute the pipeline register circuits.

Information indicating in which pipeline register circuit the delay of the operation circuit has increased can be:
stored in a non-volatile memory within the chip,
reported outside the chip,
notified to other logic circuit inside the chip, or
notified to an MPU inside the chip.

Ninth Exemplary Embodiment

Figure 15:
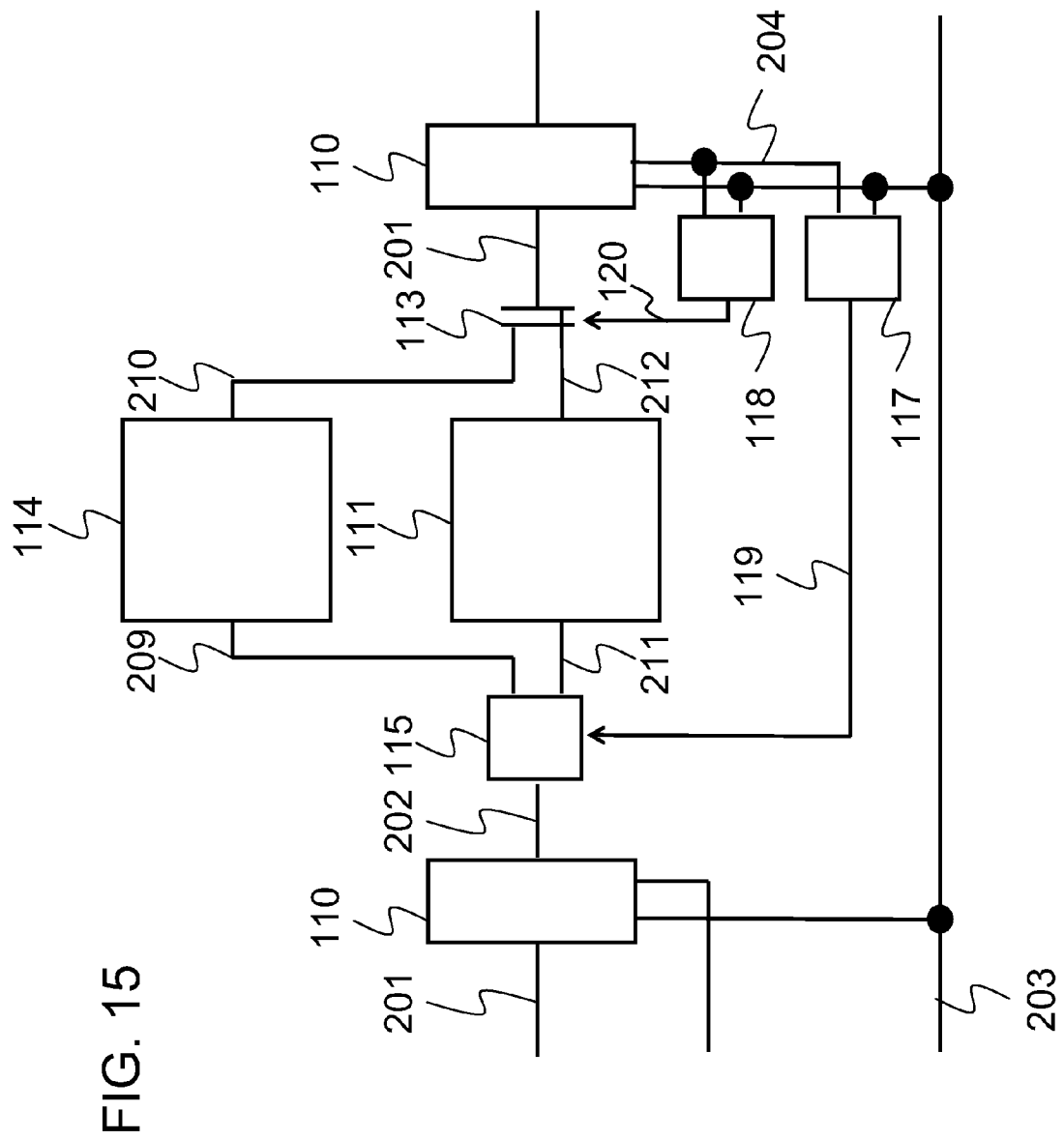
FIG. 15 is a diagram showing a configuration of a ninth exemplary embodiment of the present invention.

FIG. 15 is a diagram showing a configuration of a semiconductor integrated circuit according to a ninth exemplary embodiment of the present invention. In this exemplary embodiment, a synchronous circuit is formed in which the pipeline register circuits 110 in one of the first through sixth exemplary embodiments are employed, and a switch circuit 115, two operation circuits 111 and 114, and a selector circuit 113 are inserted between the pipeline register circuits 110. A switched state storage circuit 117 receives a clock line 203 and an error output line 204, and controls switching of the switch circuit 115. A switched state storage circuit 118 receives the clock line 203 and the error output line 204 and controls selection by the selector circuit 113.

The operation circuit 111 and the operation circuit 114 perform an operation of the same function. Respective inputs to the operation circuits 111 and 114 are connected to an output of the pipeline register circuit 110 via the switch circuit 115. Respective outputs from the operation circuits 111 and 114 are connected to an input to the pipeline register circuit 110 through the selector circuit 113.

When an output of the switched state storage circuit 117 is high, the switch circuit 115 connects an output 202 of the pipeline register circuit 110 and an input 209 to the operation circuit 114, and drops an input 211 to low. Based on an output of the switched state storage circuit 118, the selector circuit 113 selects an output 210 of the operation circuit 114 and connects the output 210 to an output 201.

On the other hand, when the output of the switched state storage circuit 117 is low, the switch circuit 115 connects the output 202 of the pipeline register circuit 110 and the input 211 to the operation circuit 111, and sets the input 209 to low. Based on the output of the switched state storage circuit 118, the selector circuit 113 selects an output 212 of the operation circuit 111 and connects the output 212 to the output 201.

An output level of the switched state storage circuit 117 is changed when the error output line 204 from the pipeline register circuit 110 (output of the determination circuit) becomes active when it is detected that the delay of the operation circuit has increased to be close to a clock cycle time. The value of the output level is held inside or outside the chip even when the semiconductor integrated circuit has been powered off, and is returned when the semiconductor integrated circuit has been powered on.

When performance of a transistor or a wiring that constitutes one of the operation circuits (111, 114) has been degraded due to secular change, and when the delay time of the one of the operation circuit 111 or 114 in FIG. 15 is then increased to cause a malfunction, the pipeline register circuit 110 in the one of the first through sixth exemplary embodiments detects that state, and outputs the state to each error output line 204.

In this case, switching is performed in the switch circuit 115 and the selector circuit 113. Then, operation can be continued or resumed using the operation circuit different from the one in which the malfunction has occurred.

In order to continue the proper operation when switching is performed in the switch circuit 115 and the selector circuit 113, a timing at which the switching is performed in the selector circuit 113 needs to be later than a timing at which the switching is performed in the switch circuit 115 and needs to be delayed by one clock or more. That is, after elapse of one clock more from when the switching in the switch circuit 115 has been performed, the switching in the selector circuit 113 needs to be performed. Then, in order to shift a timing of the switching in the switch circuit 115 and a timing of the switching in the selector circuit 113, two circuits, which are the switched state storage circuits 117 and 118, are provided. The switched state storage circuit 117 may be implemented by the flip-flop circuit (refer to reference numeral 112 in FIG. 2), for example. The switched state storage circuit 118 may be implemented by cascading two or more of the flip-flop circuits (refer to reference numeral 112 in FIG. 2), for example.

The switch circuit 115 may be deleted, and the data output line 202 may be connected to the inputs 209 and 211. In this case, the operation circuit that is not in use will also operate. Power consumption will thereby increase.

When the pipeline register circuit 100 predicts a failure, the error output line 204 becomes active. Then, an output (switch selection line) 119 of the switched state storage circuit 117 first becomes active. Then, an output (selector switching line) 120 of the switched state storage circuit 118 becomes active. A delay of one clock cycle or more may be provided from when the output (switch selection line) 119 of the switched state storage circuit 117 becomes active to when the output (selector switching line) 120 of the switched state storage circuit 118 becomes active.

When the output (switch selection line) 119 of the switched state storage circuit 117 is not active, the switch circuit 115 outputs data on the data output line 202 of the pipeline register circuit 110 to the data input line 211. At the same time, the switch circuit 115 fixes the data input line 209 at a low level or a high level.

When the output (switch selection line) 119 of the switched state storage circuit 117 is active, the switch circuit 115 outputs data on the data output line 202 of the pipeline register circuit to the data input line 209. At the same time, the switch circuit 115 fixes the data input line 211 at a low level or a high level. Alternatively, the switch circuit 115 outputs the data on the data output line 202 of the pipeline register circuit 110 to the data input line 211, and further outputs the data on the data output line 202 to the data input line 209 as well. In both of the above-mentioned cases, the switch circuit 115 outputs the data to the data input line 209.

On the other hand, when the selector switching line 120 is not active (is inactive), the selector circuit 113 outputs data on the data output line 212 to the data input line 201. When the output 120 is active, the selector circuit 113 outputs data on the data output line 210 to the data input line 201. Herein, the operation circuit 114 is the operation circuit used when a failure is predicted in a portion of the operation circuit 111.

The reason why the delay of one clock or more should be provided from when the output (switch selection line) 119 of the switched state storage circuit 117 becomes active to when the output (selector switching line) 120 of the switched state storage circuit 118 becomes active is that it may take one clock period to supply data to the operation circuit 114 by operation of the switch circuit 115 and further to the selector circuit 113. In that case, when the selector circuit 113 has been switched before completion of one clock cycle, an operation output value in a state where correct data is not supplied to the operation circuit 114 may be supplied to the pipeline register circuit. A malfunction will be thereby brought about. In that case, by employing the switch circuit 115 that outputs data to both of the data input lines 209 and 211 when the output (switch selection line) 119 of the switched state storage circuit 117 is active, and further providing the delay of one clock or more from when the output (switch selection line) 119 of the switched state storage circuit 117 becomes active to when the selector switching line 120 becomes active, the malfunction can be prevented.

There are delay differences among the clock signals to be supplied to the first storage circuit 101 and the second storage circuit 102 in the third exemplary embodiment (in FIG. 8), the fourth exemplary embodiment (in FIG. 10), and the seventh, eighth, and ninth exemplary embodiments that uses these exemplary embodiments. These differences are generated by the delay circuits 103 included in the respective pipeline register circuits.

Figure 16:
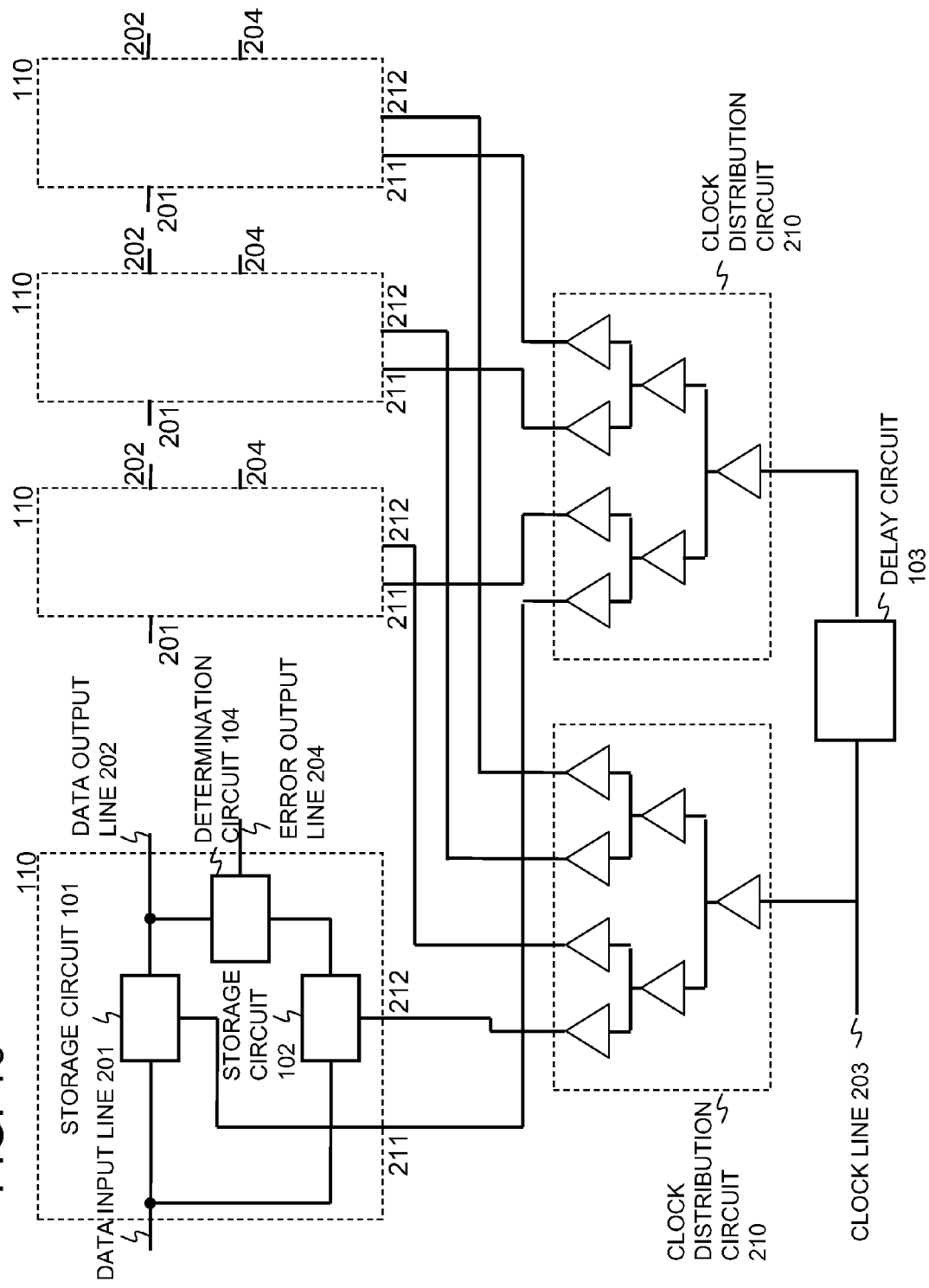
FIG. 16 is a diagram showing a configuration of a tenth exemplary embodiment of the present invention.

However, as shown in FIG. 16, a delay circuit 103 may be made common among a plurality of pipeline register circuits.

Tenth Exemplary Embodiment

FIG. 16 is a diagram showing a configuration of a tenth exemplary embodiment of the present invention. Referring to FIG. 16, a clock signal supplied to a common delay circuit 103 and a clock signal output from the delay circuit 103 are respectively supplied to a plurality of second storage circuits 102 and a plurality of first storage circuits 101 using two clock distribution circuits (clock trees) 220.

In this case, the number of the delay circuits 103 within the chip can be reduced. For this reason, even if a complex circuit configuration is made so as to make the delay circuit 103 to be more accurate, an increase in the chip area can be prevented.

Further, since the number of the delay circuits 103 is small, the delay times of the delay circuits 103 can be easily controlled by a circuit inside the chip or externally.

When the delay time is increased, a failure in the more future can be predicted. However, by doing so, the maximum delay time of an operation circuit between pipeline registers will be reduced. On the other hand, when the delay time is reduced, a failure that is highly likely to occur more recently will be predicted. The maximum delay time of the operation circuit between the pipeline registers can be increased. When a chip screening test is carried out, for example, this delay time can be increased, and a chip where a failure is more likely to occur can be discarded as a defective product. In this case, a highly accurate screening test with a very high yield rate can be carried out.

Further, when an LSI is normally operated, only a clock distribution circuit that is connected to the storage circuit 101 or storage circuit 102 connected to a data output line 202 can be operated, and operation of a clock distribution circuit that is connected to the storage circuit 101 or the storage circuit 102 not connected to the data output line 202 can be stopped. Then, operation of a determination circuit 104 can also be readily stopped.

Failure determination is not made when the LSI is normally operated. By occasionally operating the clock distribution circuit that is connected to the storage circuit 101 or the storage circuit 102 not connected to the data output line 202 when the LSI is operated, and by resuming the operation of the determination circuit 104 as well, failure prediction can be performed. Generally, a failure caused by secular change slowly occurs. In other words, there is no need for performing failure prediction with a frequency of every clock cycle. By occasionally predicting a failure, failure prediction with high accuracy can be performed.

For specifying the frequency of performing the failure prediction, the following methods may be employed:
  method of specifying the frequency according to reliability needed for the chip from outside the chip
  method of specifying the frequency in the form of once in ten thousand clock cycles or once in one microseconds inside the chip, for example
  method of specifying the frequency as a time when the chip is powered on This frequency can be adaptively changed, if necessary.

Further, when the chip screening test is carried out, it is possible to operate the semiconductor integrated circuit for the failure prediction, and to discard a chip with a small operation margin or a chip where a failure is very likely to occur, as a defective product. In this case, a highly accurate screening test with a very high yield rate can be carried out.

Normally, in clock distribution circuits, one terminal (or a small number of terminals) and a lot of terminals are connected so that a clock signal is distributed from the small number of terminals to the lot of terminals.

In each of the two clock distribution circuits 220 as well where the clock signals are distributed to the plurality of first storage circuits 101 and the plurality of second storage circuit 102, the clock signal is normally distributed in the form of a tree.

The delay circuit 103 may also be placed on the branched portion of a tree root (on a side of the small number of terminals) of these two clock distribution circuits 220 that is made common. In this case, formation of the common portion can reduce the overall size of the clock distribution circuits 220 more than in a case where the two independent clock distribution circuits are used. As a result, the chip area can be reduced. As the branched portion, an inserted portion of a gated cell in a gated clock circuit, for example, may be considered. Incidentally, as will be described later, the configuration in this exemplary embodiment in FIG. 16 may be of course combined with the configuration in FIG. 13, 14, or 15.

When a user of the semiconductor integrated circuit detects a malfunction of one of the operation circuits in advance of or after use of the semiconductor integrated circuit, for example, information on the malfunction of the operation circuit can be stored by using the first through tenth exemplary embodiments of the present invention. Then, the manufacturer of the semiconductor integrated circuit can obtain the information, can fix the semiconductor integrated circuit, or can use the information for development of a next generation version of the semiconductor integrated circuit.

By using four combinations of the seventh, eighth, and ninth exemplary embodiments of the present invention, simultaneous implementation of the exemplary embodiments can be accomplished. The four combinations are:

a combination of the seventh and eighth exemplary embodiments, a combination of the seventh and ninth exemplary embodiments, a combination of the eighth and ninth exemplary embodiments, and a combination of the seventh, eighth, and ninth exemplary embodiments In the first through ninth exemplary embodiments, an increase in the delay of one of the operation circuits was described to be caused by a secular change of the transistor or line. A factor that causes the delay of the operation circuit is not limited to the secular change in particular, and any factor that affects the delay of the operation circuit such as the temperature or supply voltage of the semiconductor integrated circuit, or a crosstalk between signal wirings may be considered.

An operation and effect of this exemplary embodiment will be described.

Even if a transistor or a wiring that constitutes the semiconductor integrated circuit has been degraded due to the secular change or the like, this exemplary embodiment can predict that the degradation will cause an anomaly or a failure of one of the operation circuits before the anomaly or the failure occurs.

The hold time of each pipeline register circuit in this exemplary embodiment is set to be not large, compared with that of an ordinary flip-flop circuit. Thus, no increase in the size of each operation circuit, no increase in the chip area, and no increase in power consumption will occur.

According to this exemplary embodiment, even if a transistor or a wiring that constitutes the semiconductor integrated circuit has been degraded due to the secular change or the like, it can be known in advance at which location of the chip a possibility of an anomaly or a failure is increased. Further, by holding an error output from the determination circuit 104, advance prediction and avoidance of a permanent failure caused by the secular change or the like can be performed.

According to this exemplary embodiment, even if a transistor or a wiring that constitutes the semiconductor integrated circuit has degraded due to the secular change or the like, it can be so arranged that no performance deterioration occurs in terms of speed and power.

In each of the exemplary embodiments described above, the description was given in connection with an example where the register circuit (flip-flop) samples and outputs a value at a data input terminal D when a clock input terminal transitions from a low level to a high level. The present invention is not of course limited to such a configuration.

Eleventh Exemplary Embodiment

FIG. 17 is a diagram showing a configuration of a semiconductor integrated circuit according to an eleventh exemplary embodiment of the present invention. In this exemplary embodiment, each logic circuit (operation circuit) is divided into functional blocks such as 8-bit adders or the like, for example. The pipeline register circuits 110 in one of the first through sixth exemplary embodiments each connected to an input and an output of the logic circuit (operation circuit) that has been divided into the functional blocks are disposed, corresponding to the functional blocks. The semiconductor integrated circuit includes a plurality of switch circuits 115, a plurality of selector circuits 113, and switched state storage circuits 117 and 118.

Though no particular limitation is imposed on the present invention, in the example shown in FIG. 17, it is assumed that each of operation circuits 111 and 114 is divided into three units (e.g. functional blocks such as three arithmetic units that perform input/output operations in a parallel manner). Three pipeline register circuits 110 are provided corresponding to three inputs to the three divided units (functional blocks), and three pipeline register circuits 110 are provided corresponding to three outputs of the three divided units. Likewise, corresponding to the three inputs to the three divided units, three selector circuits 113 and three switch circuits 115 are provided, and corresponding to the three outputs of the three divided units, three selector circuits 113 and three switch circuits 115 are provided. The switch circuit 115 corresponding to first inputs to the operation circuits 111 and 114 switches connection of its output to either one of a data input line 211 or 209, based on a signal value on a switch selection line 119 supplied to the switch circuit 115, and is connected to the first inputs to the operation circuits 111 and 114. The selector circuit 113 corresponding to first outputs of the operation circuits 111 and 114 selects one of first data output lines 212 and 210 of the operation circuits 111 and 114, based on an input value of a signal on a selector switching line 120, and outputs data to a data input line 201, thereby supplying the data to the pipeline register circuit 110 in a subsequent stage.

Likewise, each of the switch circuits 115 corresponding to second and third inputs to the operation circuits 111 and 114 switches connection of its output to either one of a data input line 211 or 209, and is connected to a corresponding one of the second and third inputs to the operation circuits 111 and 114. Each of the selector circuits 113 corresponding to second and third outputs of the operation circuits 111 and 114 selects one of second and third data output lines 212 and 210 of the operation circuits 111 and 114 based on the input value of the signal on the selector switching line 120, outputs data to a data input line 201, and supplies the data to the pipeline register circuit 110 in the subsequent stage. When the number of division into the functional blocks of each of the operation circuits 111 and 114 is set to 2 or 4 or more as well, the semiconductor integrated circuit is configured in a similar way to that in the case where the number of division into the functional blocks is set to three. In the example shown in FIG. 17, each of the operation circuits 111 and 114 may be of course treated as a functional block (operation unit) of a three-input three-output configuration.

A failure determination circuit 121 receives error output lines 204 from a plurality (three in FIG. 17) of the pipeline register circuits 110 that have been divided corresponding to a plurality (three in FIG. 17) of the functional blocks obtained by division of the operation circuit according to the function, and determines whether or not one or more of the error output lines 204 outputs a failure signal. That is, the failure determination circuit 121 determines or predicts in which functional block of the three functional blocks that constitute the operation circuit 111 a failure occurs. The failure determination circuit 121 can be implemented by an ordinary OR circuit. That is, the failure determination circuit 121 performs an OR operation on signals on the error output lines 204 (refer to FIG. 15) from the pipeline register circuits 110, thereby making error determination.

When the failure determination circuit 121 determines that there is a failure in a portion of the functional block of the operation circuit 111, an error output line 204-1 becomes active. The error output line 204-1 from the failure determination circuit 121 is supplied to the switched state storage circuits 117 and 118. The switched state storage circuit 117 that receives the error output line 204-1 from the failure determination circuit 121, which is active, makes the switch selection line 119 active. Further, the selector switching line 120, which is an output of the switched state storage circuit 118, also becomes active.

The switch circuits 115 disposed corresponding to division into the functional blocks output data on the data output lines 202 of the pipeline register circuits 110 to the data input lines 211 when the switch selection line 119, which is an output of the switched state storage circuit 117, is not active. On the other hand, the switch circuits 115 fix the data input lines 209 (non-selected data input lines) at a low level or a high level.

When the switch selection line 119, which is the output of the switched state storage circuit 117, is active, each of the switch circuits 115 disposed corresponding to division into the functional blocks outputs data on the data output line 202 connected to an output of the pipeline register circuit 110 to the data input line 211, and outputs the data on the data output line 202 to the data input line 209 as well. That is, the switch circuit 115 supplies the output data from the pipeline register circuit 110 to both of the functional blocks of the operation circuits 111 and 114.

On the other hand, when the selector switching line 120 is not active, the selector circuits 113 disposed corresponding to the division into the functional blocks select data on the data output lines 212 (output data from the functional blocks of the operation circuit 111) and output the selected data to the data input lines 201. When the selector switching line 120 is active, the selector circuits 113 select data on the data output lines 210 (output data from the functional blocks of the operation circuit 114) and outputs the selected data to the data input lines 201.

Referring to FIG. 17, the functional blocks of the operation circuit 114 are set to be spare functional blocks to be used when a failure is predicted in a portion of one of the functional blocks of the operation circuit 111.

In this exemplary embodiment, each operation circuit is divided into blocks for respective functions (functional blocks) and the functional blocks are collectively switched. With this arrangement, it is enough to provide one set of the switched state storage circuits 117 and 118 instead of a plurality of sets corresponding to all the pipeline register circuits 110. As a result, reduction of the total area (circuit area) becomes possible. In the exemplary embodiment described above, as an example of each functional block, an 8-bit adder was pointed out. A device that can collectively perform an arithmetic operation or a logic operation as one block may be used as the functional block, and no particular limitation is imposed. Further, as a variation example, instead of performing collective switching of the functional blocks between the operation circuits 111 and 114, individual switching for each functional block may be performed.

Twelfth Exemplary Embodiment

Figure 18A:
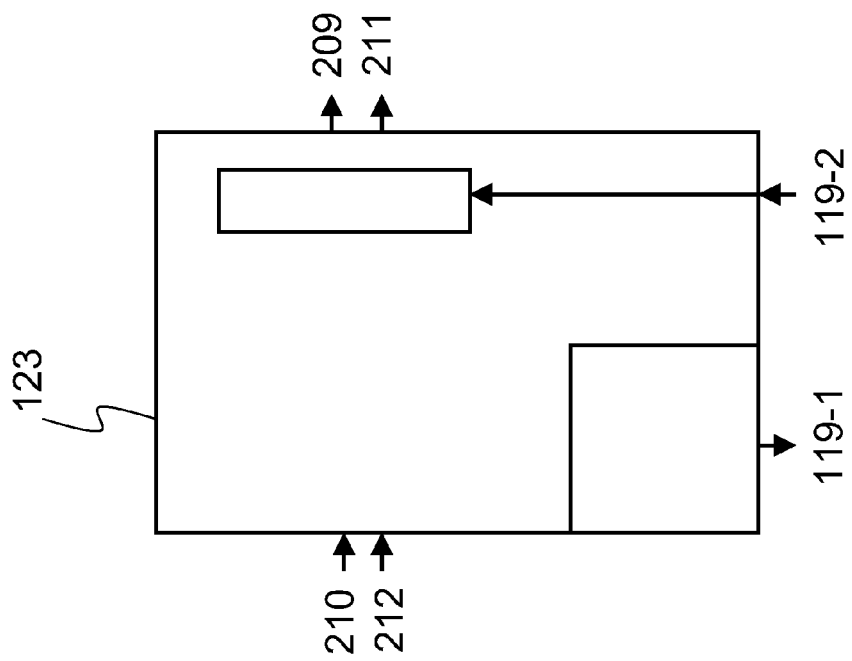
FIGS. 18A and 18B are diagrams showing a configuration of a twelfth exemplary embodiment of the present invention.
Figure 18B:
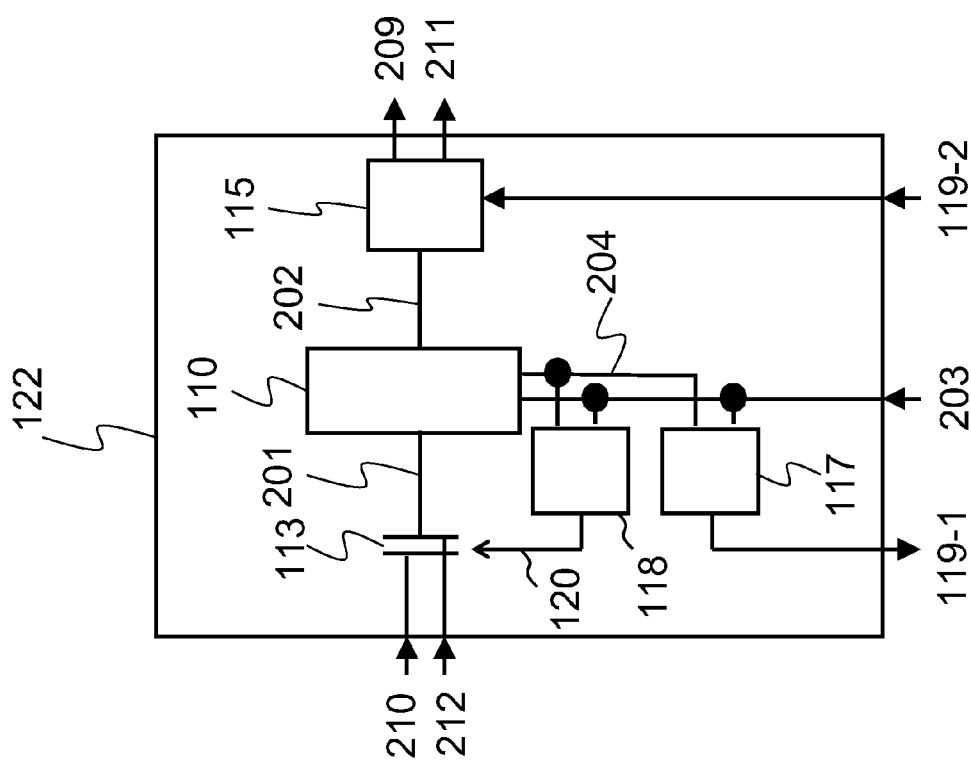

FIG. 19 is a diagram showing a configuration of a semiconductor integrated circuit according to a twelfth exemplary embodiment of the present invention. For simplification of the diagram, the pipeline register circuit 110 in one of the first through sixth exemplary embodiments, a switch circuit 115, a selector circuit 113, a switched state storage circuit 117, and a switched state storage circuit 118 are put together as shown in FIG. 18 and are indicated by a symbol (circuit symbol indicated by reference numeral 123) as shown in FIG. 18B. This symbol indicates a "failure prediction register circuit". Referring to FIG. 19, reference numerals 124 to 132 and 142 indicate failure prediction register circuits each indicated by the symbol in FIG. 18B. Referring to FIG. 19, each of duplex logic circuits 133 to 139 corresponds to a duplex circuit formed of the operation circuits 111 and 114 shown in FIG. 15, or a duplex circuit formed of the operation circuits 111 and 114 that have been divided into the functional blocks shown in FIG. 17. Each of the duplex logic circuits 133 to 139 should only be duplexed, and functions (circuit configurations) of the duplex logic circuits 133 to 139 may be naturally different to one another.

First, the failure prediction register circuit in this exemplary embodiment will be described. The failure prediction register circuit indicated by the symbol in FIG. 18B has a configuration shown in FIG. 18A. Referring to FIG. 18A, a failure prediction register 122 includes the pipeline register circuit 110, switch circuit 115, selector circuit 113, and switched state storage circuits 117 and 118. Reference numeral 119-1 indicates a failure prediction output line (corresponding to an input/output line of the switched state storage circuit 117). The failure prediction output line 119-1 is supplied to the failure register circuit in a preceding stage as a line 119-2. Reference numeral 120 indicates a selector selection line, reference numerals 201, 209, and 211 indicate data input lines, reference numerals 202, 210, and 212 indicate data output lines, reference numeral 203 indicates a clock line, and reference numeral 204 indicates an error output line.

The failure prediction register circuit 123 receives the data output line 212, which is an output of a first logic circuit (operation circuit) in the preceding stage, and the data output line 210, which is an output of a second logic circuit (operation circuit), and predicts a failure in the first logic circuit. The selector circuit 113 is switched such that when the failure is not predicted in this case, the output 212 of the first logic circuit is employed, and when the failure is predicted in the first logic circuit, the output 210 of the second logic circuit in the preceding stage is used. Then, a signal (on the switch selection line) 119-1 from the switched state storage circuit 117 is made active. The signal 119-1 is supplied to the switch circuit 115 of the failure prediction register circuit in the preceding stage as a signal 119-2.

The failure prediction register circuit 122 includes the switch circuit 115 that receives a failure prediction from the failure prediction register circuit in a subsequent stage, for the data input lines 209 and 211 that become outputs to the logic circuits in the subsequent stage. When the switch selection line 119-2 supplied to the switch circuit 115 is not active, the switch circuit 115 outputs internal data (pipeline register output 202 in FIG. 18A to the data input line 211 which becomes an input to the first logic circuit (operation circuit) in the subsequent stage. At the same time, the switch circuit 115 fixes the data input line 209 which becomes an input to the second logic circuit (operation circuit) in the subsequent stage at a low level or a high level. When the switch selection line 119-2 supplied to the switch circuit 115 is active, the switch circuit 115 outputs internal data to the data input line 211, and further outputs the internal data to the data input lien 209 as well.

In FIG. 19, when the failure prediction register circuit 132 predicts a failure in the first operation circuit (logic circuit), for example, the failure prediction output 119-1 output from the failure prediction register circuit 132 becomes active. A failure prediction output line 119 is connected to each switch circuit 115 (refer to FIG. 18A) of the failure prediction register circuits 128, 130, and 131 connected to an input to the failure prediction register circuit 132 through the duplex logic circuits alone, not through the failure prediction registers. In each of the duplex logic circuits 136, 138, and 139, switching to operation of the spare second operation circuit rather than the first operation circuit (logic circuit) is made. That is, when the failure prediction register circuit 132 predicts the failure, the duplex logic circuit where the failure may occur in the first operation circuit (logic circuit) is one of the duplex logic circuits 136, 138, and 139. By switching outputs of the failure prediction register circuits 128, 130, and 131 that outputs data to these circuit, switching is made to the operations of the spare second operation circuits 114 (in FIGS. 15 and 17 in which the second operation circuit is formed of the functional blocks) from operations of the first operation circuits 111 (in FIGS. 15 and 17 in which the second operation circuit is formed of the functional blocks) in the duplex logic circuits 136, 138, and 139 in one of which the failure may occur in the first operation circuit (logic circuit).

Further, in the failure prediction register circuit 132 that has predicted the failure, the selector circuit 113 (refer to FIG. 18A) is switched so that an input to the failure prediction register circuit 132 is an input from the spare second logic circuit (operation circuit) rather than an input from the first logic circuit (operation circuit). By doing so, when the failure prediction register circuit 132 in FIG. 19 predicts the failure, a range in which switching between the logic circuits is made can be limited to a range surrounded by a frame indicated by reference numeral 140.

When the failure prediction register circuit 142 predicts a failure, it is necessary for the switch circuit 115 (refer to FIG. 18A) of the failure prediction register circuit 128 connected to an input to the failure prediction register circuit 142 to be switched through the duplex logic circuit alone. In this case, it is necessary to switch an output of the failure prediction register circuit 128 when one of the failure prediction register circuit 142 or 132 predicts a failure. Thus, it becomes necessary to provide a circuit that determines whether or not at least one of failure prediction outputs of the failure prediction register circuits 129 and 132 is active. An OR circuit 141 can implement this need.

In this manner, in this exemplary embodiment, a range where switching is needed is narrowed, for one failure prediction. A probability of occurrence of a failure in the spare operation circuit as well can be thereby reduced.

Incidentally, referring to FIG. 19, the failure prediction register circuit 142 between the duplex logic circuits 136 and 137 may be deleted. In this case, outputs of the first and second logic circuits (operation circuits) of the duplex logic circuit 136 are respectively connected to inputs to the first and second logic circuits (operation circuits) of the duplex logic circuit 137 in a subsequent stage. Then, a failure prediction output from the failure prediction register circuit 129 is connected to the switch circuit 115 (refer to FIG. 18A) through the OR circuit 141. The failure prediction register circuit 129 is connected to the failure prediction register circuit 125 and the switch circuit 115 (refer to FIG. 18A) of the failure prediction circuit 142 directly or through the OR circuit 141. The failure prediction register circuit 125 is connected to an input to the failure prediction register circuit 129 only through the duplex logic circuit, not through the failure prediction register circuit. Accompanying deletion of the failure prediction register circuit 142, the failure prediction register circuit 128 is connected to the input to the failure prediction register circuit 129 through the duplex logic circuits 136 and 137 alone.

The eleventh and twelfth exemplary embodiments of the present invention can be combined to be carried out, according to characteristics of a circuit to be applied. Division using the functional blocks shown in the eleventh exemplary embodiment is often suited to an operation circuit such as an adder which performs processing on a bit-by-bit basis. Division using small units, as shown in the eleventh exemplary embodiment, is often suited to a random logic circuit such as a control circuit.

In this exemplary embodiment, a redundancy configuration including a spare circuit, which is capable of being switched, is the operation circuit (logic circuit) alone. The failure prediction register shown in FIG. 18 does not have its spare circuit. Thus, it is effective for the failure spare register to take following measures in order to prevent occurrence of a defect as much as possible:
thickening wires
widening wiring intervals
forming a plurality of contact holes and a plurality of through holes The configuration in FIG. 16 may be of course combined with the configuration in FIG. 17 or 19.

The above description was directed to the present invention in connection with the exemplary embodiments described above. The present invention is not limited to the configurations of the exemplary embodiments described above, and naturally includes various variations and modifications that could be made by those skilled in the art within the scope of the present invention.

The invention claimed is:

1. A failure prediction circuit comprising:
   a delay circuit having an input connected to a data line, the delay circuit delaying an input signal by a predetermined delay time to output the delayed signal;
   first and second storage circuits having data input terminals respectively connected to the input and the output of the delay circuit; and
   a determination circuit that compares outputs of the first and second storage circuits to determine whether or not the outputs of the first and second storage circuits coincide; wherein
   the first and second storage circuits have respective clock input terminals connected in common to a clock line, and store logic levels of the respective data input terminals at a time point when the clock line transitions from a first logic level to a second logic level, and output the stored logic levels.

2. The failure prediction circuit according to claim 1, comprising:
   a circuit that stores a result of the comparison by the determination circuit and holds a result of the determination by the determination circuit when the outputs of the first storage circuit and the second storage circuit are not the same.

3. The failure prediction circuit according to claim 1, wherein
   an output of the determination circuit is connected to an error output line that outputs a comparison result of the outputs of the first storage circuit and the second storage circuit.

4. A pipeline register circuit comprising:
   the failure prediction circuit as set forth in claim 1;
   the data line of the failure prediction circuit being supplied to the pipeline register circuit and the output of the first storage circuit in the failure prediction circuit being set to an output of the pipeline register circuit.

5. A semiconductor integrated circuit comprising:
   the failure prediction circuit as set forth in claim 1;
   a delay value of the delay circuit being adjusted after manufacture of a chip.

6. A failure prediction circuit comprising:
a delay circuit having an input connected to a clock line, the delay circuit delaying an input signal by a predetermined delay time to output the delayed signal;
first and second storage circuits having data input terminals connected in common to a data line and having clock input terminals respectively connected to the input to and the output of the delay circuit; and
a determination circuit comparing outputs of the first and second storage circuits to determine whether or not the outputs of the first and second storage circuits coincide; wherein
the first and second storage circuits store logic levels of the data input terminals at time points when the respective clock input terminals thereof transition from a first logic level to a second logic level to output the stored logic levels.

7. The failure prediction circuit according to claim 6, wherein
the clock input terminals of the first and second storage circuits are respectively connected to one output of a first clock distribution circuit having an input connected to the input to the delay circuit and one output of a second clock distribution circuit having an input connected to the output of the delay circuit.

8. The failure prediction circuit according to claim 6, comprising:
a circuit that stores a result of the comparison by the determination circuit and holds a result of the determination by the determination circuit when the outputs of the first storage circuit and the second storage circuit are not the same.

9. The failure prediction circuit according to claim 6, wherein
an output of the determination circuit is connected to an error output line that outputs a comparison result of the outputs of the first storage circuit and the second storage circuit.

10. A failure prediction circuit comprising:
first and second storage circuits having data input terminals connected in common to a data line and having clock input terminals connected in common to a clock line, the first and second storage circuits respectively storing logic levels of the data input terminals at a time point when the clock input terminals thereof transition from a first logic level to a second logic level to output respectively the stored logic levels; and
a determination circuit comparing the outputs of the first and second storage circuits to determine whether or not the outputs of the first and second storage circuits coincide; wherein
a logic threshold by which the first storage circuit determines a logic level of the data line and a logic threshold by which the second storage circuit that determines a logic level of the data line are set to values that are different to each other.

11. A semiconductor integrated circuit comprising:
the failure prediction circuit as set forth in claim 10;
the logic thresholds of the first and second storage circuits being adjusted after manufacture of a chip.

12. The failure prediction circuit according to claim 10, comprising:
a circuit that stores a result of the comparison by the determination circuit and holds a result of the determination by the determination circuit when the outputs of the first storage circuit and the second storage circuit are not the same.

13. The failure prediction circuit according to claim 10, wherein
an output of the determination circuit is connected to an error output line that outputs a comparison result of the outputs of the first storage circuit and the second storage circuit.

14. A pipeline register circuit comprising:
first and second storage circuit, each storage circuit sampling an input data signal in response to an input clock signal to output the sampled data signal; and
a determination circuit determining whether or not the outputs of the first and second storage circuits coincide;
at least one of input timings of the data signal, input timings of the clock signal, and input logic thresholds of the data signal being set to be different from each other between the first and second storage circuits in data sampling,
the output of a predetermined one of the first and second storage circuits being set to register output data.

15. The pipeline register circuit according to claim 14, wherein the pipeline register circuit constitutes a pipeline register circuit wherein in one clock cycle, an operation of each operation circuit before and after which the pipeline register circuits are arranged is completed and an operation result of the operation circuit in a preceding stage is supplied to the operation circuit in a subsequent stage through the pipeline register circuit, and the operation and supply of the operation result performed in the one clock cycle are repeated for each clock cycle,
the timings at which the pipeline register circuit obtains the data signal indicating the operation result from the operation circuit in the preceding stage being set to be before a timing at which the pipeline register circuit outputs the data signal to the operation circuit in the subsequent stage so as to determine whether or not the operation result from the operation circuit in the preceding stage is correct to allow prediction of a failure in the operation circuit in the preceding stage.

16. A semiconductor integrated circuit comprising:
a plurality of pipeline register circuits, each pipeline register circuit outputting a logic level of an input line to an output line, responsive to a change in a logic level of a clock line;
first and second operation circuits performing equivalent logic or arithmetic operations; and
a selector circuit selecting one of outputs of the first and second operation circuits to connect the selected output to an input of the pipeline register in a subsequent stage;
the pipeline register circuit comprising the pipeline register circuit as set forth in claim 14,
inputs to the first and second operation circuits being connected to an output of a corresponding one of the pipeline register circuits,
switching in the selector circuit being made, using a result of the determination circuit as a switching control signal.

17. The semiconductor integrated circuit according to claim 16, wherein
each of the first and second operation circuits is divided into functional blocks; and
the semiconductor integrated circuit comprises:
a failure determination circuit determining presence or absence of a failure based on outputs of the first and second operation circuits; and
according to a determination result of the failure determination circuit, an output destination of the pipeline register circuit is switched to a corresponding input to one of the first and second operation circuits, and selection of one of the outputs of the first and second operation circuits is selected to be supplied to an input to a corresponding one of the pipeline register circuits in a subsequent stage.

18. The semiconductor integrated circuit according to claim 16, wherein
when the determination result of the determination circuit in one of the pipeline register circuits indicates a failure, the determination result is transmitted to the switch circuit that performs switching of connection of an output of other one of the pipeline register circuits to either one of the inputs to the first and second operation circuits, and the switch circuit performs switching of connection of the output of the other one of the pipeline register circuits to either one of the inputs to the first and second operation circuits, according to the determination result of the failure in the one of the pipeline register circuits, the output of the other one of the pipeline register circuits operating on an input to the one of the pipeline register circuits.

19. The semiconductor integrated circuit according to claim 16, comprising:
a failure determination circuit determining presence or absence of a failure based on outputs of a plurality of functional blocks, the functional blocks being obtained by division of each of the operation circuits;
according to a determination result of the failure determination circuit, switching of an output determination of the pipeline register circuit to an input to one of the functional blocks and switching of an output from the one of the functional blocks to an input to the pipeline register in a subsequent stage being made,
when a determination result of one of the pipeline register circuits indicates a failure, switching of an output determination of other one of the pipeline register circuits to one of the operation circuits or one of the functional blocks being made, the output determination operating on an input to the one of the pipeline register circuits;
the semiconductor integrated circuit comprising:
a first region where switching of respective outputs to the functional blocks and switching of respective inputs from the functional blocks are made according to the result of the failure determination circuit; and
a second region where switching of respective outputs to the first and second operation circuits is made according to the result of the determination circuit.

20. A semiconductor integrated circuit, comprising:
a plurality of pipeline register circuits, each of the pipeline register circuits outputting a logic level of an input line to an output line, responsive to a change in a logic level of a clock line, each of the pipeline register circuits, comprising the pipeline register circuit as set forth in claim 14;
first and second operation circuits performing equivalent logic or arithmetic operations;
a switch circuit performing switching of connection of the output of the pipeline register circuit to either one of inputs to the first operation circuit and the second operation circuit; and
a selector circuit selecting one of outputs of the first and second operation circuits to connect the selected output to an input of the pipeline register in a subsequent stage;
switching in the switch circuit and switching in the selector circuit being made, using a determination result of the determination circuit as a switching control signal.

21. The semiconductor integrated circuit according to claim 20, comprising:
circuits which generate the switching control signals that control the switching in the switch circuit and the switching in the selector circuit, respectively,
a timing at which the switching in the selector circuit is made being set to be after a timing at which the switching in the switch circuit is made, and being controlled to be delayed from the timing of the switching in the switch circuit, by one clock cycle or more.

22. A semiconductor integrated circuit comprising:
a plurality of pipeline register circuits, each of the pipeline register circuits outputting a logic level of an input line to an output line, responsive to a change in a logic level of a clock line, each of the pipeline register circuits comprising the pipeline register circuit as set forth in claim 14; and
a storing circuit, wherein, when non-coincidence is detected by the determination circuit, and a failure is predicted, information on the non-coincidence is collected in a predetermined location in the chip through a scan path that serially connects the pipeline registers, the storing circuit storing information on which failure prediction circuit within a chip has predicted a failure.

23. The semiconductor integrated circuit according to claim 22, wherein by counting a number of scan clocks, it is possible to identify on which failure prediction circuit in the pipeline register circuit has predicted a failure.

24. The semiconductor integrated circuit according to claim 22, wherein
the information on which failure prediction circuit within the chip has predicted the failure is stored in a nonvolatile memory provided in the chip or outside the chip.

25. A semiconductor integrated circuit comprising:
a plurality of the pipeline register circuits as set forth in claim 14, each of the pipeline register circuits including a logic circuit that transmits information on non-coincidence of storage results of the first storage circuit and the second storage circuit to a subsequent stage, when a comparison result of the determination circuit indicates that the storage results of the first storage circuit and the second storage circuit do not coincide.

26. A semiconductor integrated circuit comprising:
a plurality of the pipeline register circuits as set forth in claim 14,
corresponding to each of the plurality of the pipeline register circuits, the semiconductor integrated circuit comprising:
a selector selecting one of an output of the determination circuit and an output from a preceding stage; and
a latch circuit holding an output of the selector and outputs the held output to a subsequent stage.

27. A semiconductor integrated circuit comprising:
a plurality of the pipeline register circuits as set forth in claim 14;
first and second operation circuits performing equivalent logic or arithmetic operations; and
a selector circuit selecting one of outputs of the first and second operation circuits to connect the selected output to an input of the pipeline register circuit in a subsequent stage;
inputs to the first and second operation circuits being connected to an output of the pipeline register circuit through a switch circuit,
switching in the switch circuit and switching in the selector circuit being performed, using a determination result of the determination circuit as a switching control signal.

28. A semiconductor integrated circuit comprising:
a plurality of pipeline register circuits, each of the pipeline register circuits outputting a logic level of an input line to an output line, responsive to a change in a logic level of a clock line, each of the pipeline register circuits comprising the pipeline register circuit as set forth in claim 14;
first and second operation circuits performing equivalent logic or arithmetic operations, each of the first and second operation circuits being divided into functional blocks;
switch circuits, each of the switch circuit switching connection of the output of the pipeline register circuit to one of inputs to the first and operation circuits;
selector circuits, each of the selector circuits selecting one of outputs of the first and second operation circuits to connect the selected output to an input of the pipeline register circuit in a subsequent stage, the switch circuits and the selector circuits being provided corresponding to the inputs to and the outputs of the first and second operation circuits; and
a failure determination circuit receiving determination results from the determination circuits of a plurality of the pipeline register circuits and determining presence of a failure in one of the plurality of the pipeline register circuits;
according to a determination result of the failure determination circuit, the switch circuit performing switching of an output destination of the pipeline register circuit to a corresponding input to one of the first and second operation circuits and the selector circuit selecting the one of the outputs of the first and second operation circuits to be supplied to an input to a corresponding one of the pipeline register circuits in a subsequent stage.

29. A semiconductor integrated circuit comprising:
a plurality of duplex logic circuits, each of duplex logic circuits including first and second operation circuits performing equivalent logic or arithmetic operations;
a plurality of failure prediction register circuits, each of the failure prediction register circuits comprising:
a selector circuit selecting one of outputs of the first and second operation circuits of the duplex logic circuit to output the selected output;
a pipeline register circuit receiving the output of the selector circuit; and
a switch circuit switching connection of an output of the pipeline register circuit to either one of inputs to the first and second operation circuits in the duplex logic circuit that receives the output of the pipeline register circuit;
the pipeline register circuit comprising the pipeline register circuit as set forth in claim 14,
as a signal that performs switching, a determination result of the determination circuit in the pipeline register circuit in one of the failure prediction register circuits being directly supplied to the switch circuit connected to one of the failure prediction register circuits through one or a plurality of the duplex logic circuits, not through any one of the failure prediction register circuits, or
being supplied to the switch circuit through a logic circuit, the logic circuit receiving a determination result of the determination circuit in the pipeline register circuit in other one of the failure prediction register circuits, together with the determination result in the one of the failure prediction register circuits, and outputting the signal that performs switching when one of the received determination results indicates a failure.

30. A failure prediction method, wherein first and second storage circuits are provided as registers, each of the registers receiving a data signal output from an operation circuit, sampling the data signal in response to an input clock signal to output the sampled data signal; the method comprising:
setting at least one of input timings of the data signal, input timings of the clock signal, and input logic thresholds of the data signal to be different from each other between the first and second storage circuits in data sampling;
comparing the output of the first storage circuit with the output of the second storage circuit when a logic level of a clock line transitions from a first logic level to a second logic level; and
predicting a type of a failure or a failure location in the operation circuit, based on a comparison result of the outputs of the first storage circuit and the second storage circuit.

* * * * *